(12) United States Patent
Hu et al.

(10) Patent No.: US 10,340,222 B2
(45) Date of Patent: Jul. 2, 2019

(54) STAIR CONTACT STRUCTURE, MANUFACTURING METHOD OF STAIR CONTACT STRUCTURE, AND MEMORY STRUCTURE

(71) Applicant: MACRONIX INTERNATIONAL CO., LTD., Hsinchu (TW)

(72) Inventors: Chih-Wei Hu, Miaoli County (TW); Teng-Hao Yeh, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/791,521

(22) Filed: Oct. 24, 2017

(65) Prior Publication Data

US 2019/0122983 A1    Apr. 25, 2019

(51) Int. Cl.
*H01L 23/528* (2006.01)
*H01L 27/11556* (2017.01)
*H01L 21/027* (2006.01)
*H01L 21/311* (2006.01)
*H01L 21/3213* (2006.01)
(Continued)

(52) U.S. Cl.
CPC ...... *H01L 23/5283* (2013.01); *H01L 21/0273* (2013.01); *H01L 21/31116* (2013.01); *H01L 21/31144* (2013.01); *H01L 21/32135* (2013.01); *H01L 21/32139* (2013.01); *H01L 21/76805* (2013.01); *H01L 21/76877* (2013.01); *H01L 23/5226* (2013.01); *H01L 27/11521* (2013.01); *H01L 27/11556* (2013.01); *H01L 27/11568* (2013.01); *H01L 27/11582* (2013.01);
(Continued)

(58) Field of Classification Search
CPC ............ H01L 23/5226; H01L 23/5283; H01L 27/115; H01L 27/11548; H01L 27/11519; H01L 27/11565; H01L 27/11575
See application file for complete search history.

(56) References Cited

U.S. PATENT DOCUMENTS 8,405,142 B2 *  3/2013  Katsumata .......... H01L 29/7926
                                                257/314
8,956,968 B2   2/2015  Higashitani et al.
(Continued)

FOREIGN PATENT DOCUMENTS

TW          201714249 A      4/2017

OTHER PUBLICATIONS

TIPO Office Action dated Jun. 8, 2018 in Taiwan application (No. 106136410).

*Primary Examiner* — Allison Bernstein
(74) *Attorney, Agent, or Firm* — McClure, Qualey & Rodack, LLP

(57) ABSTRACT

A stair contact structure, a manufacturing method of a stair contact structure, and a memory structure are provided. The stair contact structure includes several layers of stacking structures and a first etch stop layer. Each stacking structure includes a conductive layer and an insulating layer. The conductive layers and the insulating layers are interlaced. The first etch stop layer penetrates through the stacking structures and extends along a first horizontal direction. The conductive layers of the stacking structures located at a first sidewall of the first etch stop layer have a plurality of contact points, and the contact points are arranged along the first horizontal direction to form a stair structure having a plurality of stages.

12 Claims, 49 Drawing Sheets

(51) Int. Cl.
  *H01L 21/768* (2006.01)
  *H01L 27/11568* (2017.01)
  *H01L 27/11582* (2017.01)
  *H01L 23/522* (2006.01)
  *H01L 27/11521* (2017.01)
  *H01L 21/3205* (2006.01)
  *H01L 21/02* (2006.01)

(52) U.S. Cl.
  CPC .... *H01L 21/0217* (2013.01); *H01L 21/02164* (2013.01); *H01L 21/32055* (2013.01)

(56) References Cited

U.S. PATENT DOCUMENTS

| | | |
|---|---|---|
| 9,087,790 B2 | 7/2015 | Oh et al. |
| 9,425,209 B1 | 8/2016 | Yang et al. |
| 9,449,987 B1* | 9/2016 | Miyata ............. H01L 27/11582 |
| 9,502,429 B2* | 11/2016 | Hironaga .......... H01L 27/11556 |
| 9,589,981 B2* | 3/2017 | Nishikawa ........ H01L 27/11582 |
| 2013/0130468 A1 | 5/2013 | Higashitani et al. |
| 2013/0130495 A1 | 5/2013 | Higashitani et al. |
| 2016/0133638 A1 | 5/2016 | Simsek-Ege et al. |
| 2017/0256551 A1* | 9/2017 | Lee ...................... H01L 27/115 |

* cited by examiner

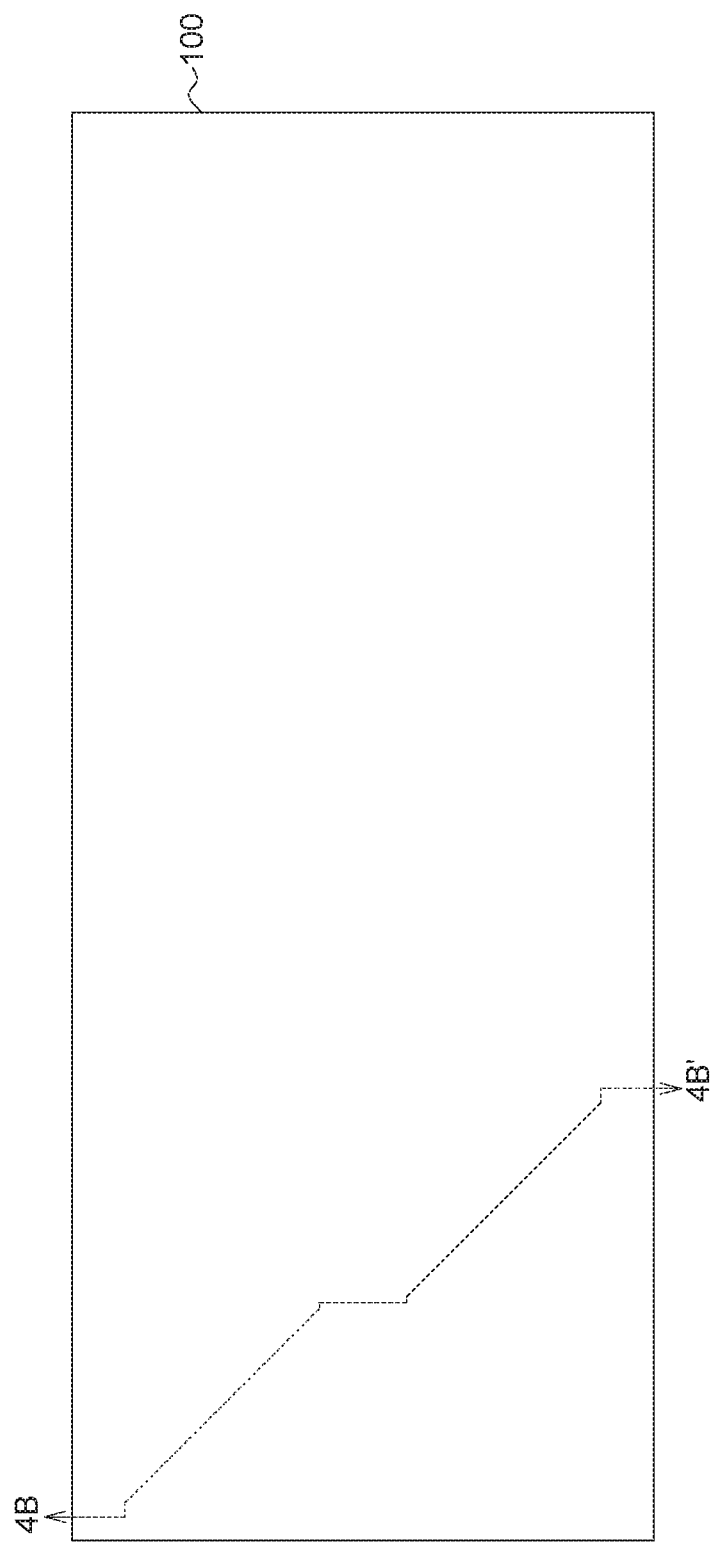

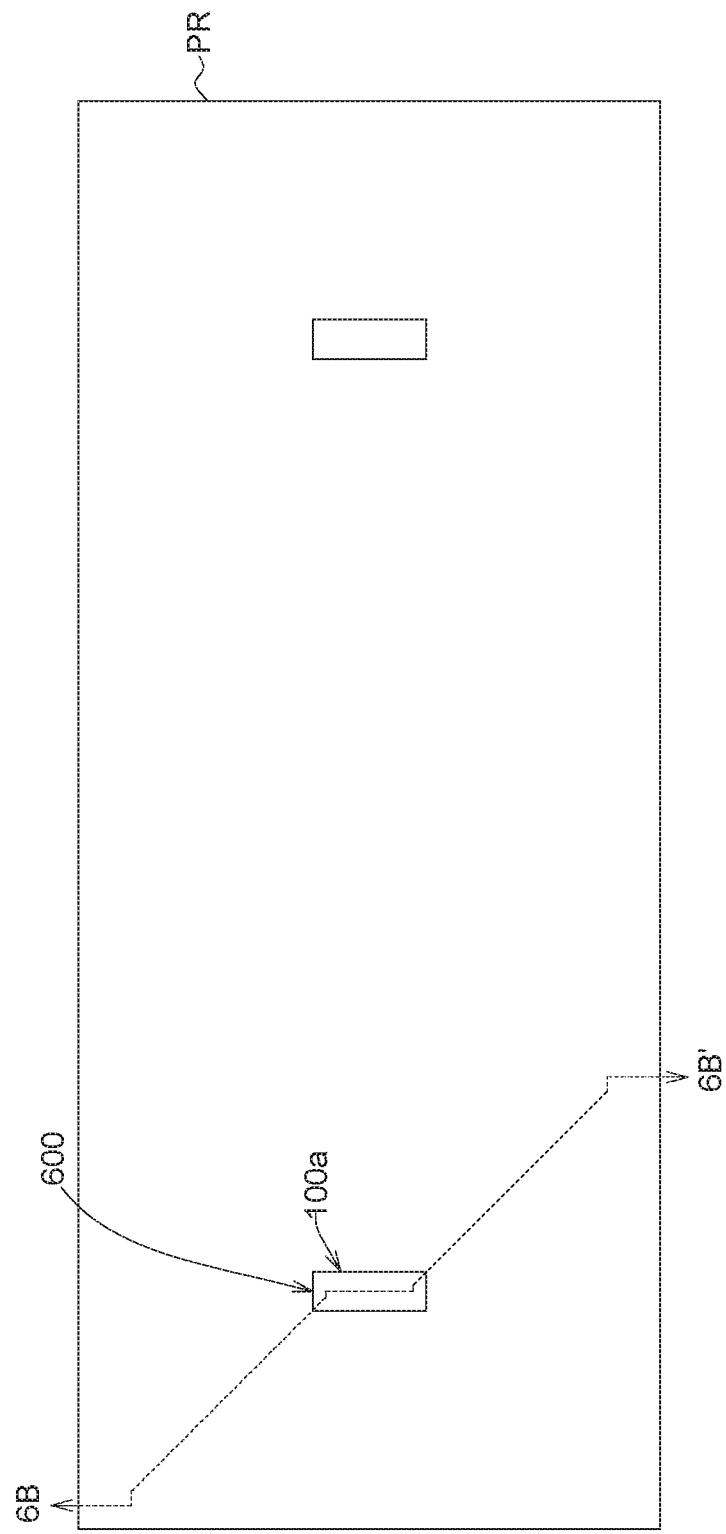

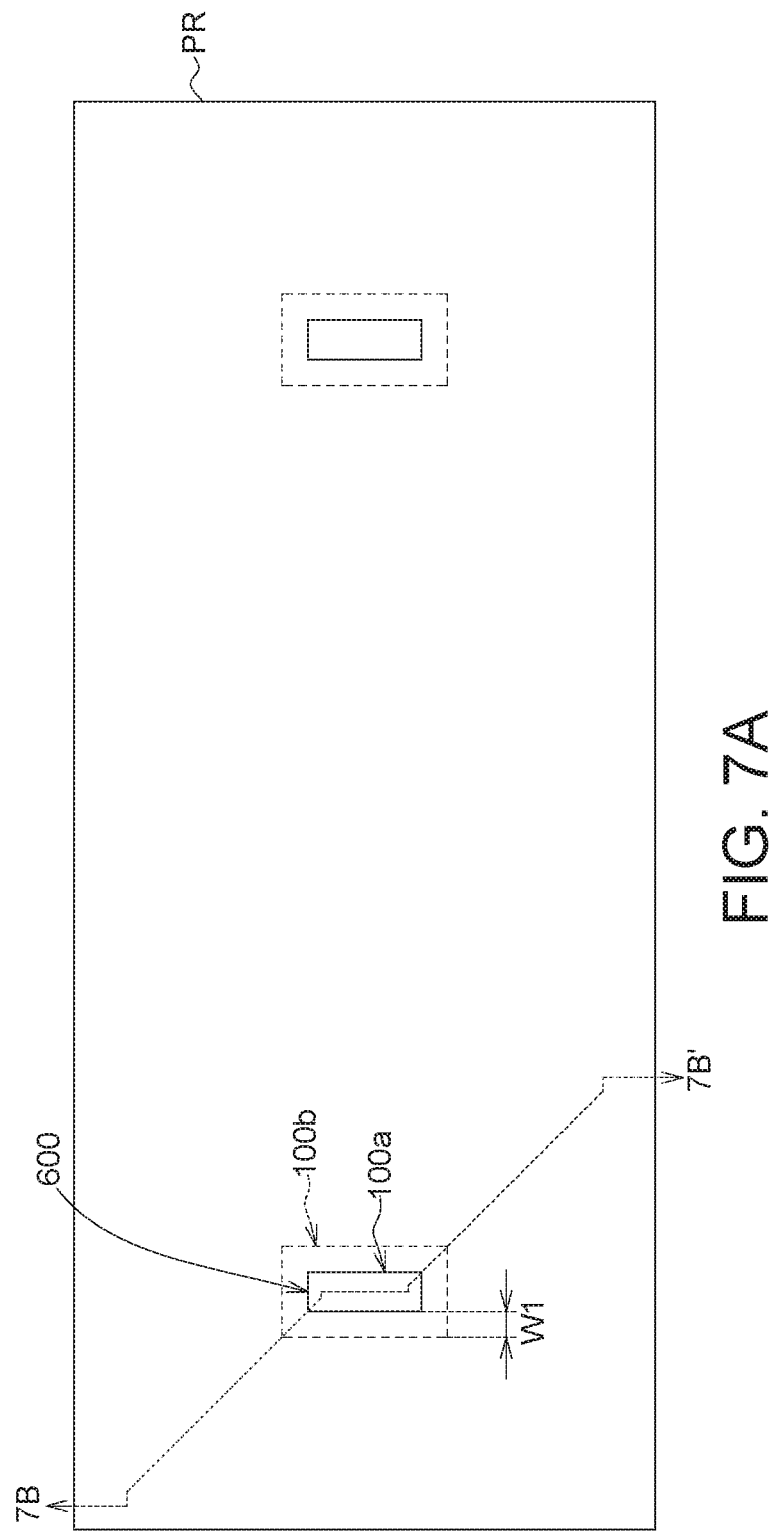

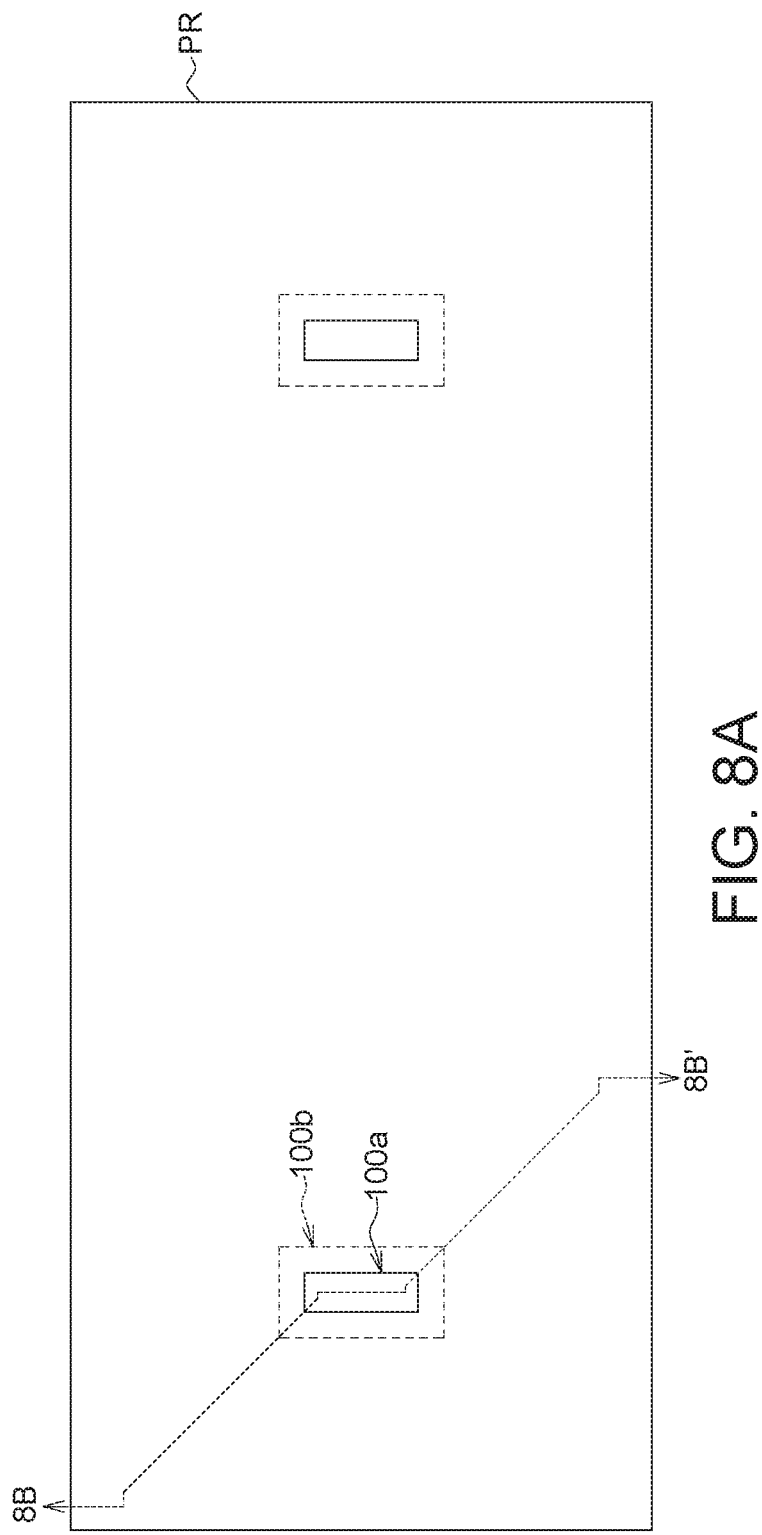

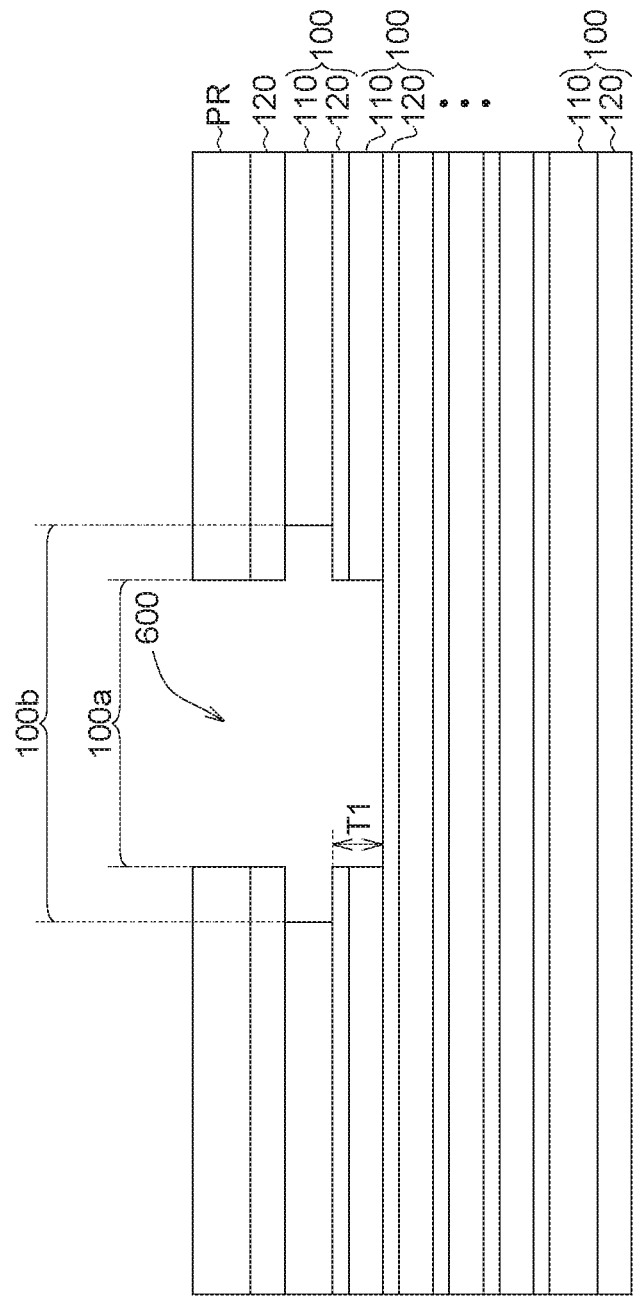

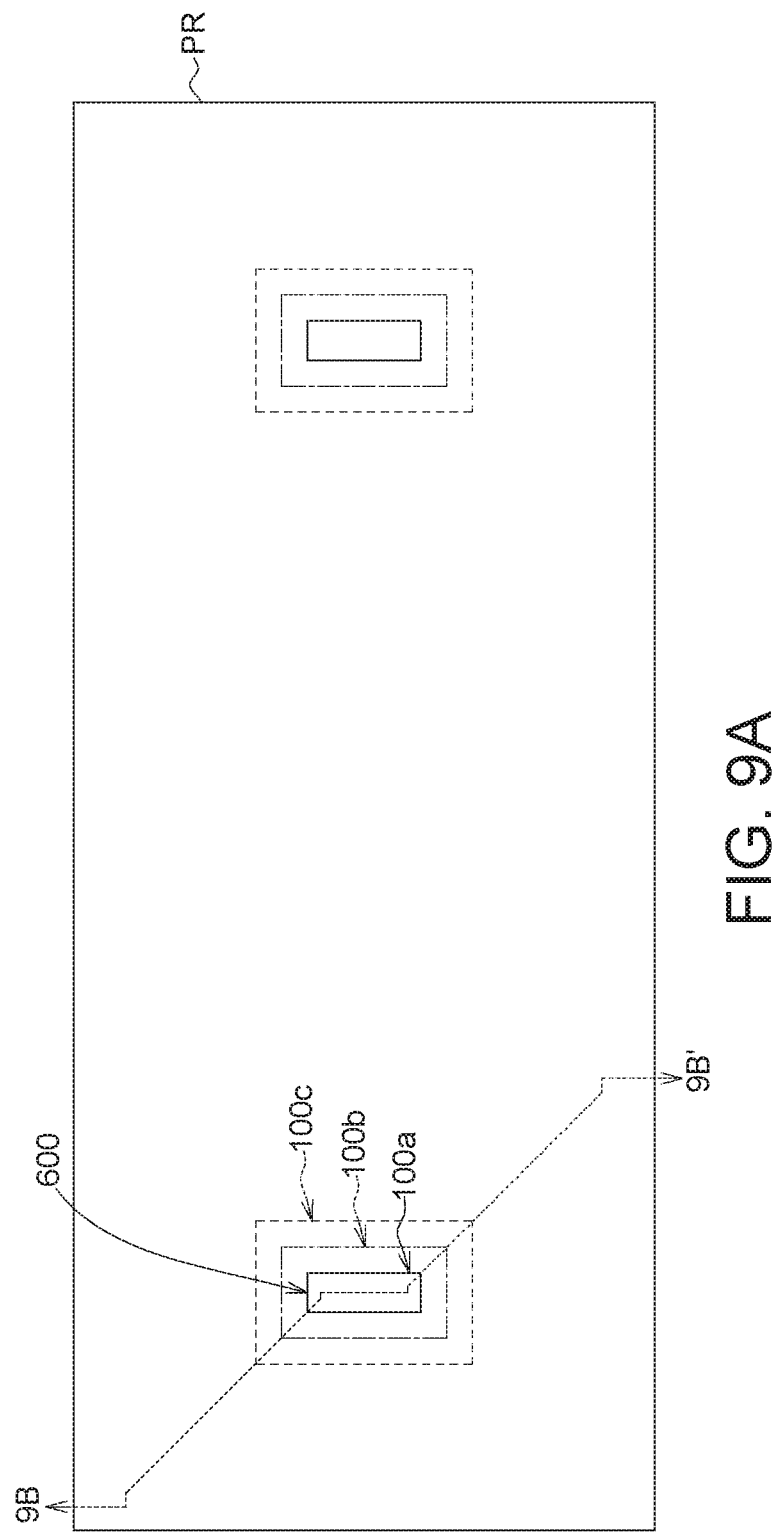

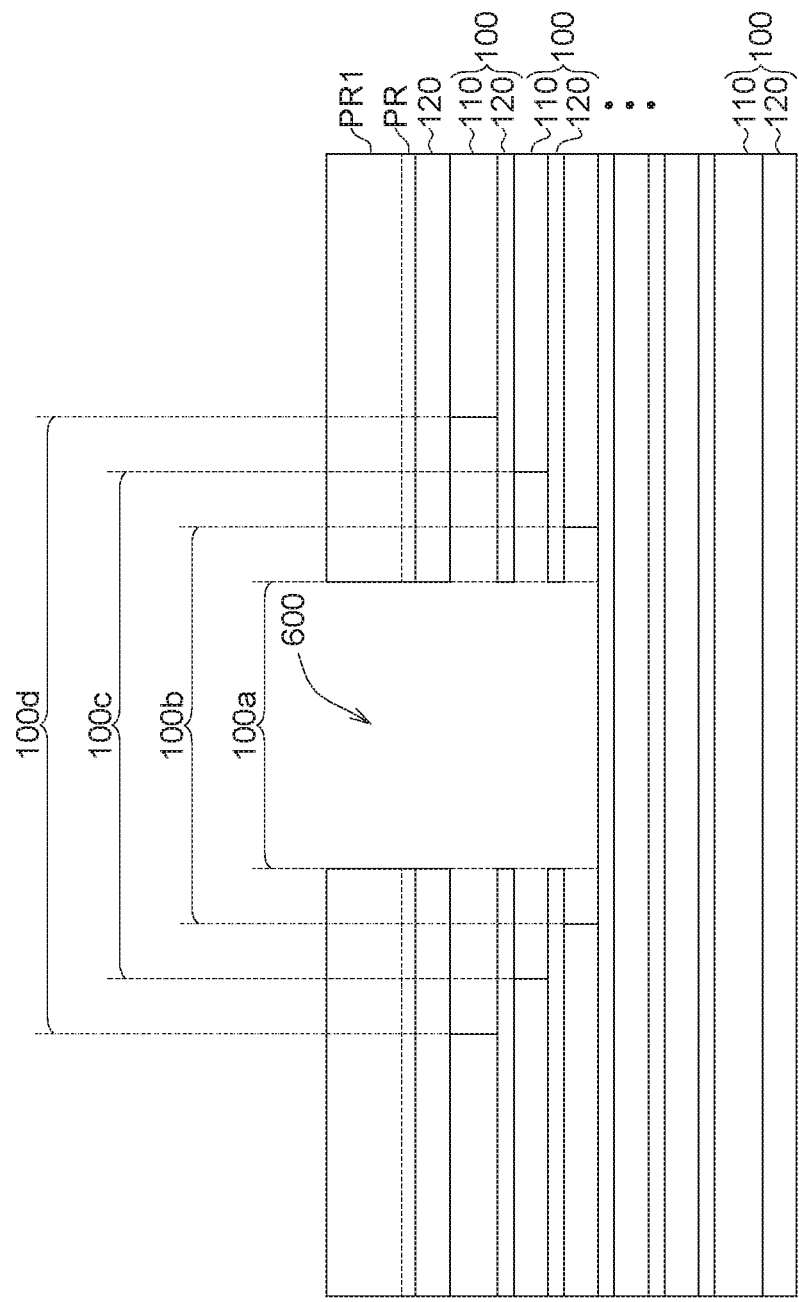

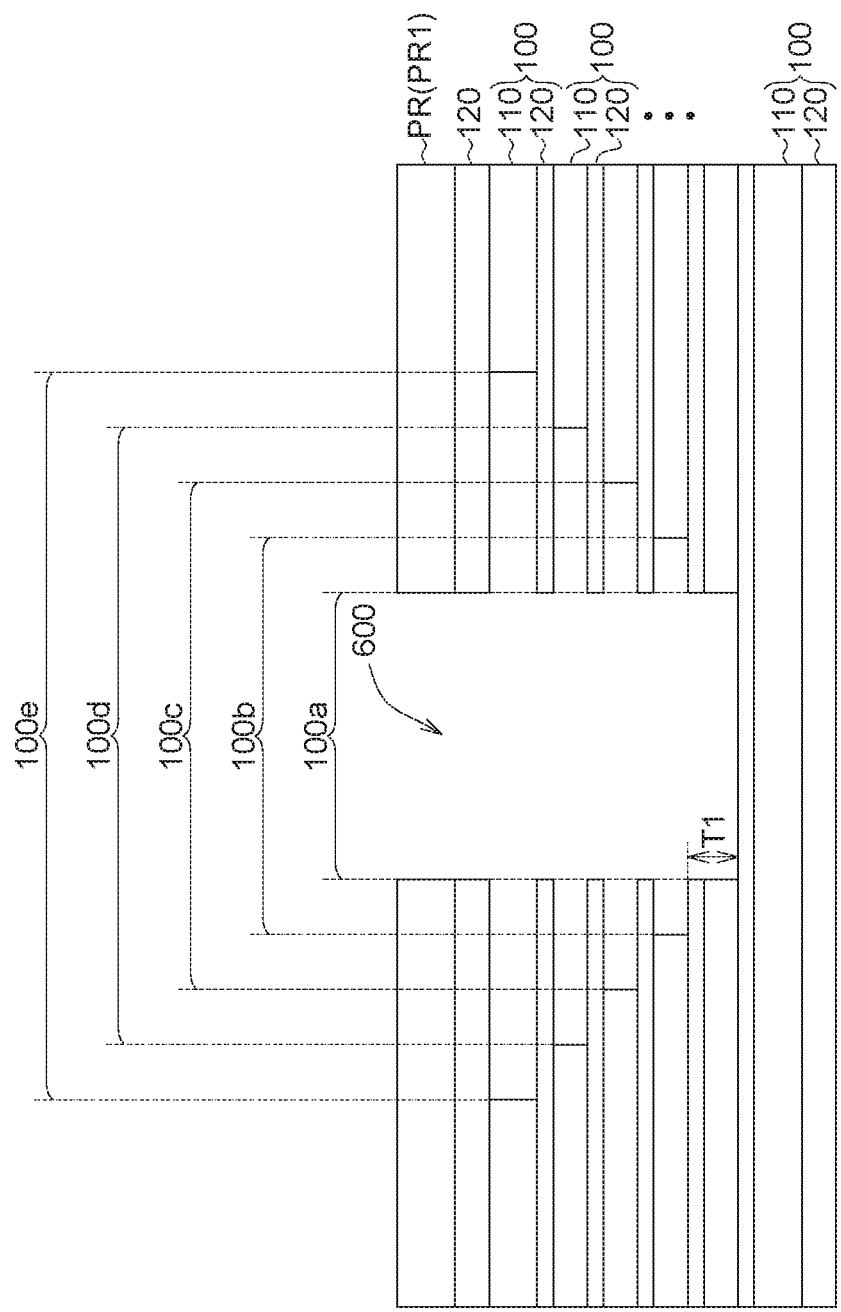

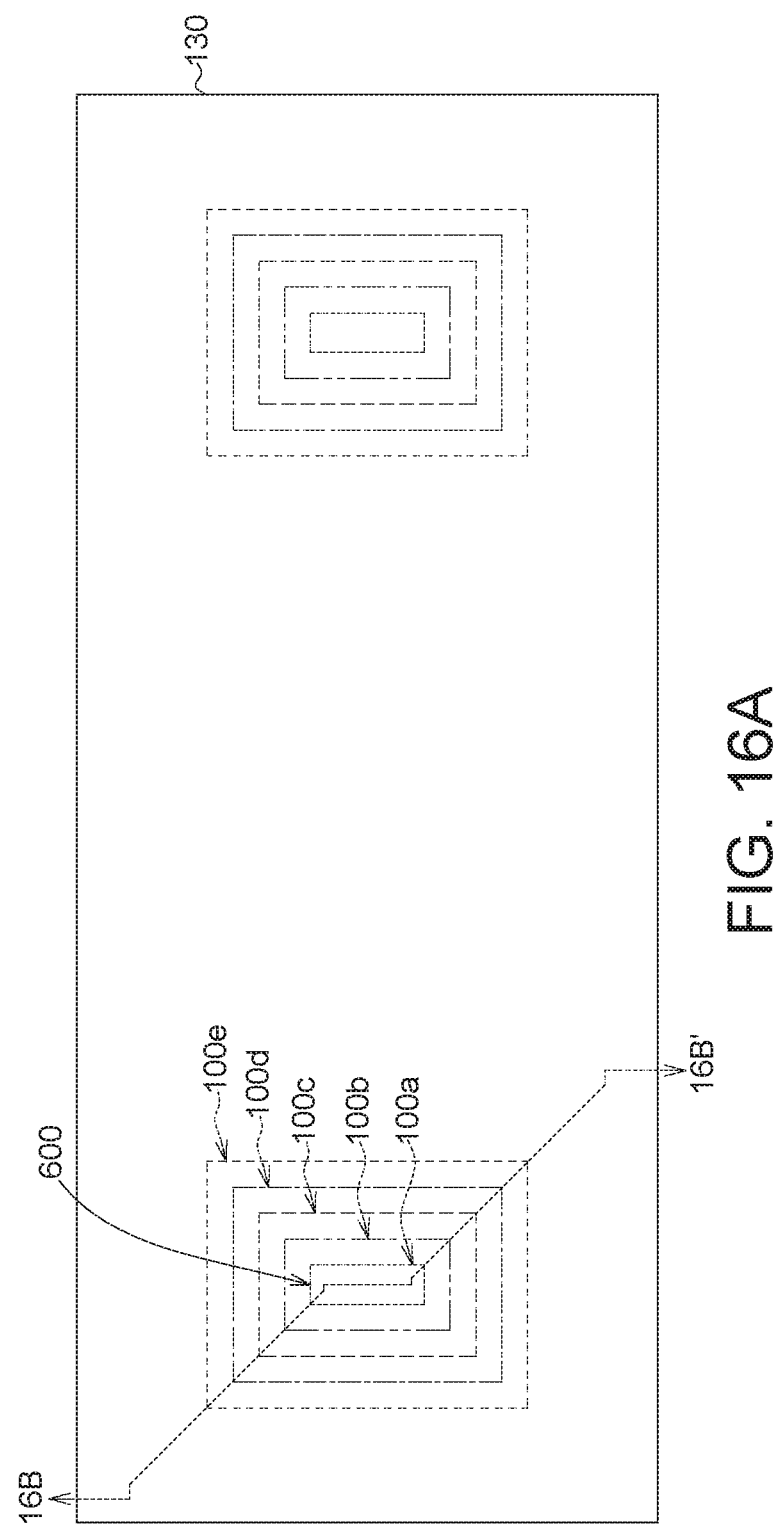

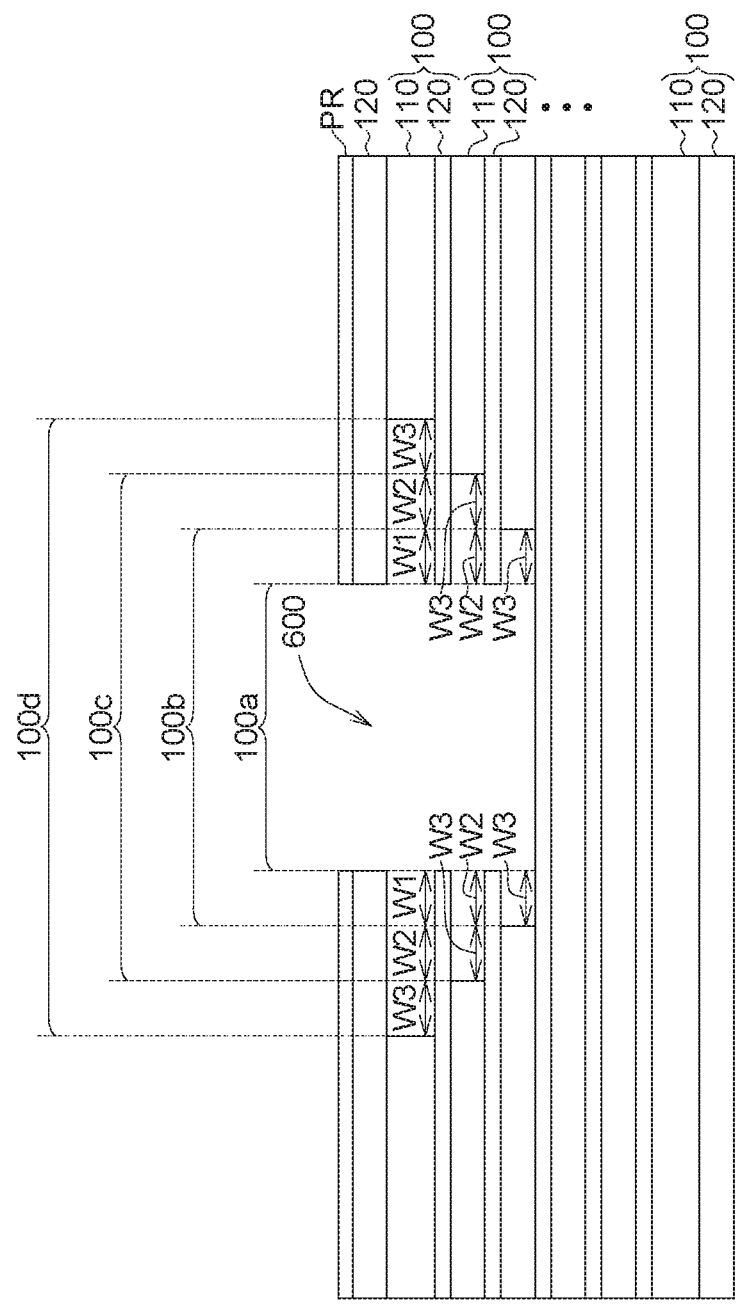

STAIR CONTACT STRUCTURE, MANUFACTURING METHOD OF STAIR CONTACT STRUCTURE, AND MEMORY STRUCTURE

BACKGROUND

Technical Field

The present disclosure related in general to a stair contact structure, a manufacturing method of a stair contact structure, and a memory structure.

Description of the Related Art

With the development of semiconductor technology, various semiconductor elements are provided. The semiconductor elements can be installed to realize various electric performances. Semiconductor elements are widely used in various electronic products, such as memory device and etc.

Stair structures are commonly used in contact pad regions of 3D memory devices. However, in order to manufacture stair structures with multiple contact points located in different levels of the stair structures, a large amount of photo mask steps together with etching steps are required. Multiple photo mask steps with comparable multiple etching steps result in a great increase of manufacturing costs, and the complexity of the manufacturing processes is increased as well.

SUMMARY

The present disclosure is directed to a stair contact structure, a manufacturing method of a stair contact structure, and a memory structure. In the embodiments, the contact points of the conductive layers in the stair contact structure are arranged along the extending direction of the first etch stop layer to form a stair structure having a plurality of stages, such that the distance between the stair contact structure and the memory array can be reduced, and the effects of reduction of the overall size and area of the memory structure can be further achieved.

According to an embodiment of the present disclosure, a stair contact structure is provided. The stair contact structure includes a plurality of layers of stacking structures and a first etch stop layer. Each stacking structure includes a conductive layer and an insulating layer, and the conductive layers and the insulating layers are interlaced. The first etch stop layer penetrates through the stacking structures vertically and extends along a first horizontal direction. The conductive layers of the stacking structures located at a first sidewall of the first etch stop layer have a plurality of contact points, and the contact points are arranged along the first horizontal direction to form a stair structure having a plurality of stages.

According to another embodiment of the present disclosure, a memory structure is provided. The memory structure includes a first stair contact structure, a second stair contact structure, a first memory block and a second memory block. The first stair contact structure and the second stair contact structure are separated from each other by a trench. The first stair contact structure and the second stair contact structure respectively includes a plurality of layers of stacking structures, each stacking structure includes a conductive layer and an insulating layer, and the conductive layers and the insulating layers are interlaced. The conductive layers of the first stair contact structure have a plurality of first contact points, the conductive layers of the second stair contact structure have a plurality of second contact points, the first contact points and second contact points are arranged respectively along a first direction and a second direction to form a first stair structure and a second stair structure having a plurality of stages, and the first direction is different from the second direction. The first memory block and the second memory block are respectively electrically connected to the first stair contact structure and the second stair contact structure.

According to a further embodiment of the present disclosure, a manufacturing method of a stair contact structure is provided. The manufacturing method of the stair contact structure includes the following steps: forming a plurality of layers of stacking structures, wherein each stacking structure includes a conductive layer and an insulating layer, and the conductive layers and the insulating layers are interlaced; forming a patterned photoresist on the stacking structures, wherein the patterned photoresist has an opening; and etching N times the stacking structures by using the patterned photoresist as a mask, N being a positive integer, each time of etching the stacking structures includes: performing a dry etching process on the stacking structures; and performing an isotropic etching process on the stacking structures; wherein in etch time of performing the dry etching process on the stacking structures, a thickness of one layer of a portion of the stacking structures is etched away, and in etch time of performing the isotropic etching process on the stacking structures, a width of one or more than one conductive layer of the conductive layers of the stacking structures is trimmed off; and wherein the conductive layers of the stacking structures have a plurality of contact points, and the contact points are arranged along a horizontal direction to form a stair structure having a plurality of stages.

The above and other aspects of the disclosure will become better understood with regard to the following detailed description of the non-limiting embodiment(s). The following description is made with reference to the accompanying drawings.

BRIEF DESCRIPTION OF THE DRAWINGS

FIG. 4A to FIG. 18B show a flow chart of a manufacturing method of a memory structure including stair contact structures according to an embodiment of the present disclosure.

DETAILED DESCRIPTION

In the embodiments of the present disclosure, the contact points of the conductive layers in the stair contact structure are arranged along the extending direction of the first etch stop layer to form a stair structure having a plurality of stages, such that the distance between the stair contact structure and the memory array can be reduced, and the effects of reduction of the overall size and area of the memory structure can be further achieved. Preferred embodiments are disclosed below for elaborating the invention. The following embodiments are for the purpose of elaboration only, not for limiting the scope of protection of the invention. Besides, secondary elements are omitted in the following embodiments to highlight the technical features of the invention.

Figure 1:
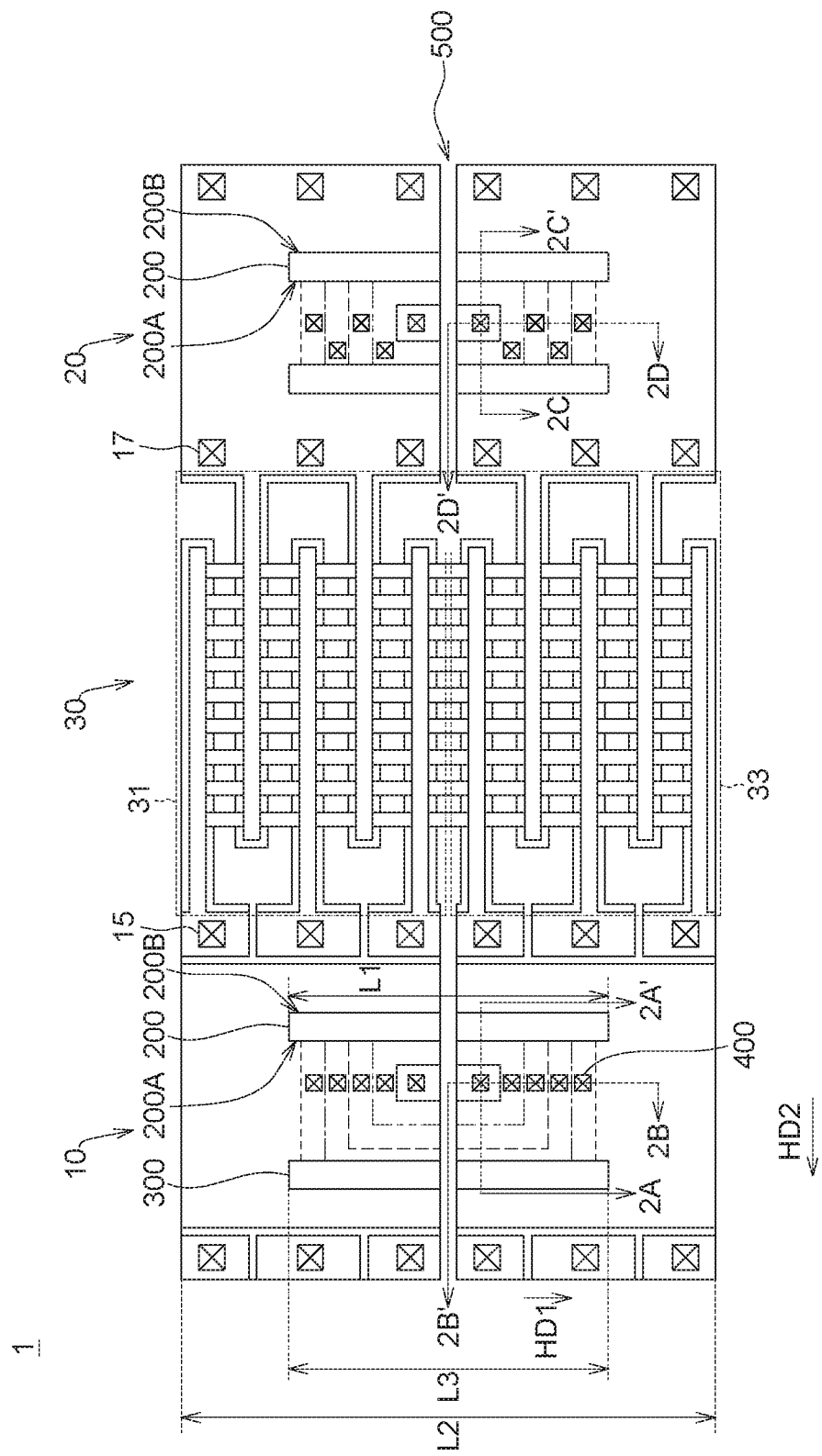
FIG. 1 shows a top view of a memory structure including stair contact structures according to an embodiment of the present disclosure.
Figure 2A:
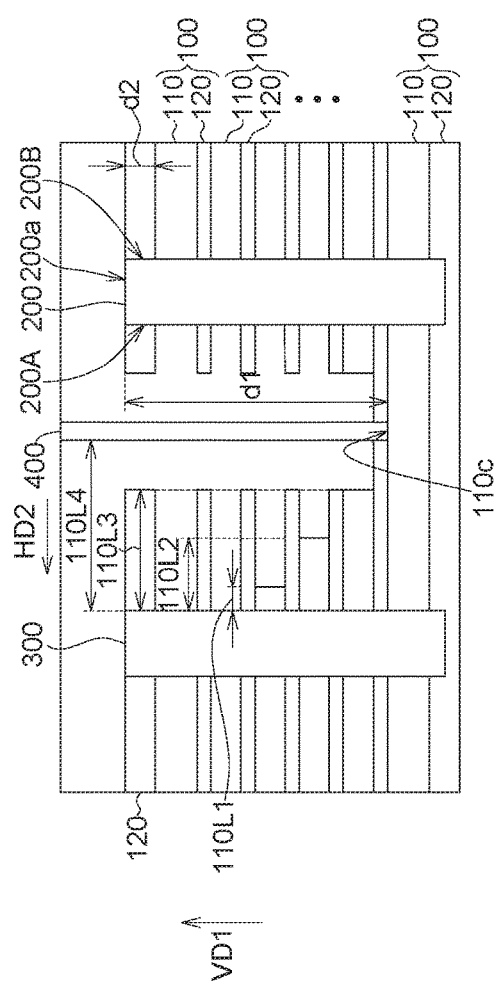
FIG. 2A shows a cross-sectional view along the cross-sectional line 2A-2A in FIG. 1.
Figure 2B:
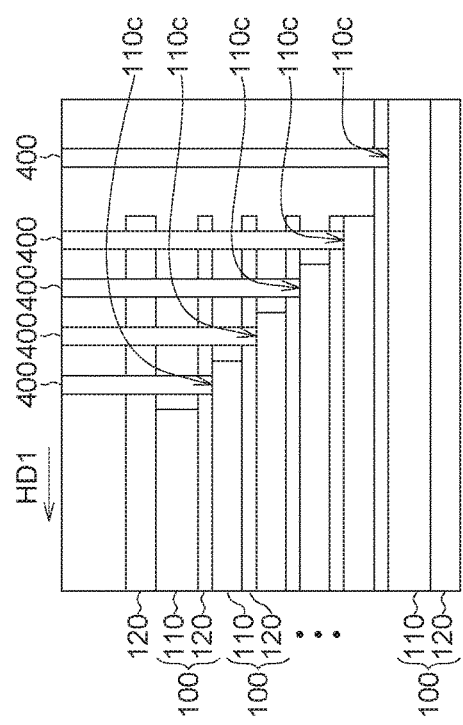
FIG. 2B shows a cross-sectional view along the cross-sectional line 2B-2B' in FIG. 1.
Figure 2C:
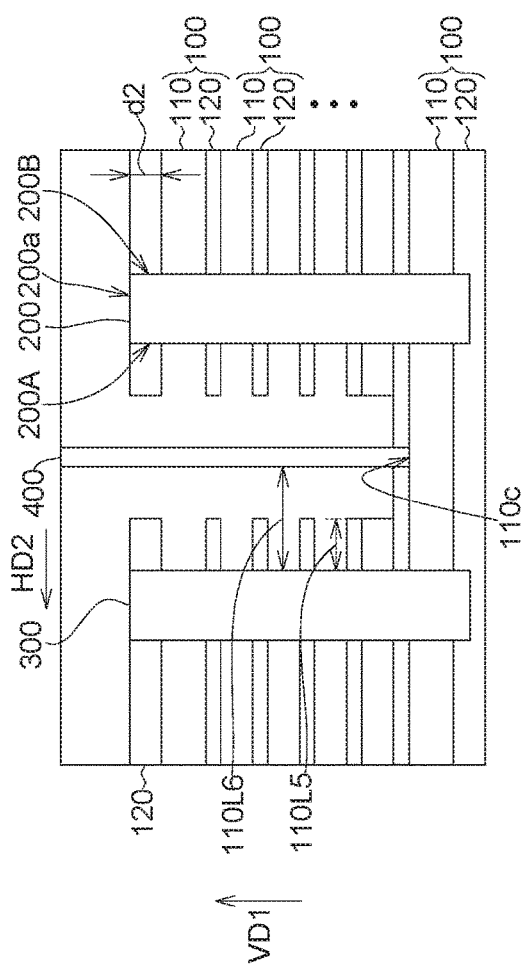
FIG. 2C shows a cross-sectional view along the cross-sectional line 2C-2C' in FIG. 1.
Figure 2D:
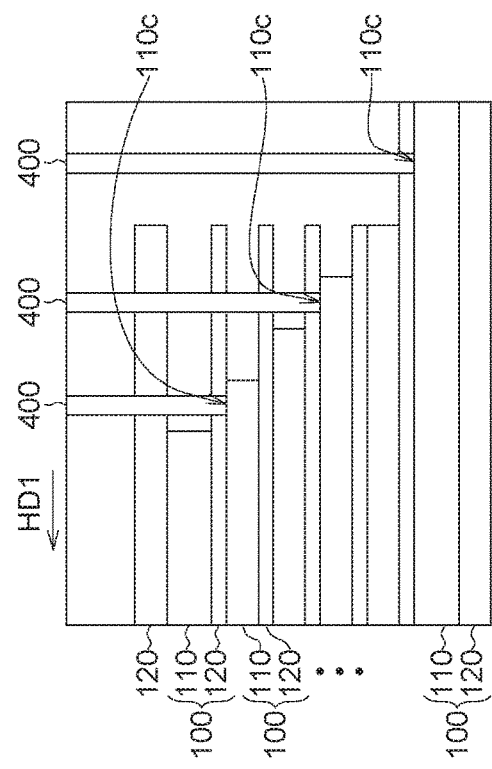
FIG. 2D shows a cross-sectional view along the cross-sectional line 2D-2D' in FIG. 1.

FIG. 1 shows a top view of a memory structure including stair contact structures according to an embodiment of the present disclosure, FIG. 2A shows a cross-sectional view along the cross-sectional line 2A-2A' in FIG. 1, FIG. 2B shows a cross-sectional view along the cross-sectional line 2B-2B' in FIG. 1, FIG. 2C shows a cross-sectional view along the cross-sectional line 2C-2C' in FIG. 1, and FIG. 2D shows a cross-sectional view along the cross-sectional line 2D-2D' in FIG. 1.

As shown in FIGS. 1 and 2A-2D, the memory structure 1 includes stair contact structures 10 and 20 and a memory array 30, and the memory array 30 is located between the stair contact structure 10 and the stair contact structure 20. In some embodiments, the memory array may include a plurality of memory blocks, for example, memory blocks 31 and 33; the stair contact structure 10 is, for example, a SSL contact pad region and may include a plurality of SSL contact pads 15; the stair contact structure 20 is, for example, a GSL contact pad region and may include a plurality of GSL contact pads 17; the memory array 30 is, for example, a 3D NAND memory array; but the present disclosure is not limited thereto.

In some embodiments, as shown in FIG. 1, the memory structure 1 may further have a trench 500 separating the stair contact structure 10 into two separate contact structures and separating the stair contact structure 20 into two separate contact structures. The two separate contact structures of each of the stair contact structure 10 and the stair contact structure 20 are respectively electrically connected to different memory blocks.

As shown in FIGS. 1 and 2A-2D, the stair contact structure 10/20 includes a plurality of layers of stacking structures 100 and a first etch stop layer 200. Each stacking structure 100 includes a conductive layer 110 and an insulating layer 120, and the conductive layers 110 and the insulating layers 120 are interlaced. The first etch stop layer 200 penetrates through the stacking structures 100 vertically and extends along a first horizontal direction HD1. The conductive layers 110 of the stacking structures 100 located at a first sidewall 200A of the first etch stop layer 200 have a plurality of contact points 110c, and the contact points 110c are arranged along the first horizontal direction HD1 to form a stair structure having a plurality of stages.

In the embodiments, the material of the conductive layer 110 includes such as polysilicon, the material of the insulating layer 120 includes such as silicon oxide, and the material of the first etch stop layer 200 includes such as silicon nitride. In the embodiments, the topmost conductive layer 110 is electrically connected to such as the SSL contact pads 15 and/or the GSL contact pads 17, the bottommost conductive layer 110 is electrically connected to such as the inversion gate, and the conductive layers 110 in the middle are electrically connected to such as the word lines in the memory array 30.

According to the embodiments of the present disclosure, the contact points 110c of the conductive layers 110 in the stair contact structure 10/20 are arranged along the extending direction (i.e. the first horizontal direction HD1) of the first etch stop layer 200 to form a stair structure having a plurality of stages, such that the distance between the stair contact structure 10/20 and the memory array 30 can be reduced, and the effects of reduction of the overall size and area of the memory structure can be further achieved.

As shown in FIGS. 1 and 2A-2D, the stair contact structure 10/20 may further include a second etch stop layer 300. The second etch stop layer 300 penetrates through the stacking structures 100 vertically and extending along the first horizontal direction HD1. The aforementioned contact points 110c are located between the first etch stop layer 200 and the second etch stop layer 300.

According to the embodiments of the present disclosure, the contact points 110c of the conductive layers 110 in the stair contact structure 10/20 are arranged along the extending direction (i.e. the first horizontal direction HD1) of the first etch stop layer 200 to form a stair structure having a plurality of stages, and the contact points 110c are located between the first etch stop layer 200 and the second etch stop layer 300, such that the area occupied by the stair contact structure 10/20 is limited in the strip-shaped region between the first etch stop layer 200 and the second etch stop layer 300, and thus the size and area occupied by the stair contact structure 10/20 can be further reduced, and the effects of reduction of the overall size and area of the memory structure can be further achieved effectively.

According to some embodiments, the locations of the first etch stop layer 200 and the second etch stop layer 300 can be switched; in addition, when the stair contact structure 10/20 includes only the first etch stop layer 200 and does not include the second etch stop layer 300, the first etch stop layer 200 can be arranged at the location where the second etch stop layer 300 is located as shown in FIGS. 1, 2A and 2C.

In the embodiments, as shown in FIG. 1, the first etch stop layer 200 has a first length L1 along the first horizontal direction HD1, the stacking structures 100 have a second length L2 along the first horizontal direction HD1, and the second length L2 is larger than the first length L1.

In the embodiments, as shown in FIG. 1, the second etch stop layer 300 has a third length L3 along the first horizontal direction HD1, and the second length L2 of the stacking structures 100 is larger than the third length L3 of the second etch stop layer 300.

In the embodiments, as shown in FIGS. 2A and 2C, the first etch stop layer 200 has a second sidewall 200B opposite to the first sidewall 200A, the first etch stop layer 200 has a top surface 200a, the top surface 200a is kept apart from one contact point 110c of the plurality of contact points 110c by a first distance d1, the top surface 200a is kept apart from the topmost conductive layer 110 of the conductive layers 110 located at the second sidewall 200B of the first etch stop layer 200 by a second distance d2, and the first distance d1 is larger than the second distance d2.

In the embodiments, as shown in FIGS. 1, 2A and 2C, the conductive layers 110 located between the first etch stop layer 200 and the second etch stop layer 300 have a plurality of lengths along a second horizontal direction HD2, the second horizontal direction HD2 is perpendicular to the first horizontal direction HD1, and the lengths of the conductive layers 110 are different.

In some embodiments, the lengths 110L1-110L6 of the conductive layers 110 increase downwards along a vertical direction VD1, and the vertical direction VD1 is perpendicular to the first horizontal direction HD1 and the second horizontal direction HD2. For example, as shown in FIG. 2A, the lengths 110L1, 110L2, 110L3 and 110L4 of the conductive layers 110 increase downwards along the vertical direction VD1; as shown in FIG. 2C, the lengths 110L5 and 110L6 of the conductive layers 110 increase downwards along the vertical direction VD1.

In the embodiments, as shown in FIGS. 1 and 2A-2D, the stair contact structure 10/20 may further include a plurality of conductive lines 400, and each conductive line 400 is electrically connected to each contact point 113c.

Figure 3A:
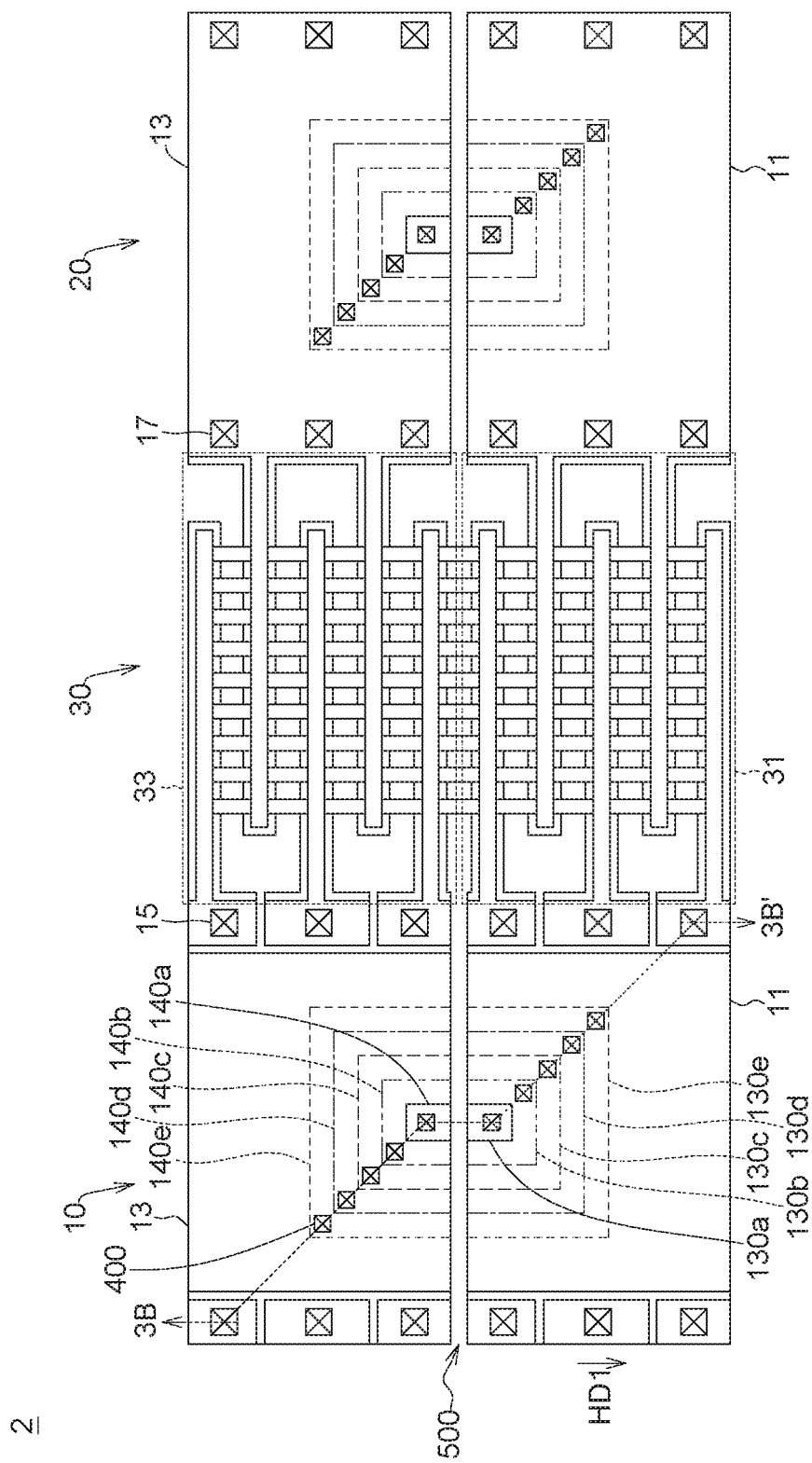
FIG. 3A shows a top view of a memory structure including stair contact structures according to another embodiment of the present disclosure.
Figure 3B:
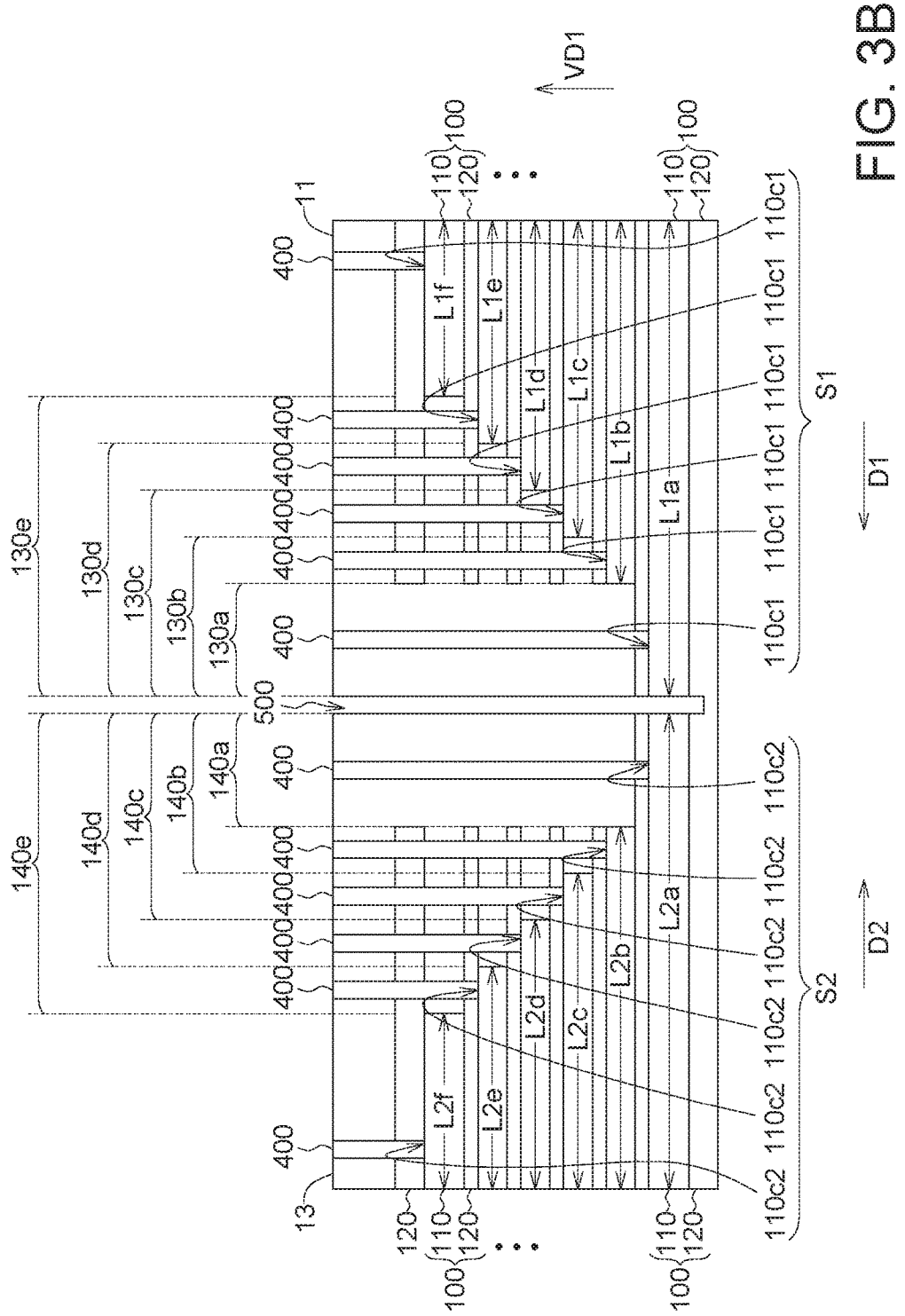
FIG. 3B shows a cross-sectional view along the cross-sectional line 3B-3B' in FIG. 3A.

FIG. 3A shows a top view of a memory structure including stair contact structures according to another embodiment of the present disclosure, and FIG. 3B shows a cross-sectional view along the cross-sectional line 3B-3B' in FIG. 3A. The elements in the present embodiment sharing similar or the same labels with those in the previous embodiment are similar or the same elements, and the description of which is omitted.

As shown in FIGS. 3A-3B, the memory structure 2 includes a first stair contact structure 11, a second stair contact structure 13, a first memory block 31 and a second memory block 33. The first stair contact structure 11 and the second stair contact structure 13 are separated from each other by a trench 500. The first memory block 31 and the second memory block 33 are respectively electrically connected to the first stair contact structure 11 and the second stair contact structure 13. In the embodiments, the two sets of the first stair contact structure 11 and the second stair contact structure 13 form the stair contact structure 10 and the stair contact structure 20, respectively, the first memory block 31 and the second memory block 33 form the memory array 30, and the memory array 30 is located between the stair contact structure 10 and the stair contact structure 20. In some embodiments, the stair contact structure 10 is, for example, a SSL contact pad region and may include a plurality of SSL contact pads 15; the stair contact structure 20 is, for example, a GSL contact pad region and may include a plurality of GSL contact pads 17; the memory array 30 is, for example, a 3D NAND memory array; but the present disclosure is not limited thereto.

The first stair contact structure 11 and the second stair contact structure 13 respectively includes a plurality of layers of stacking structures 100, each stacking structure 100 includes a conductive layer 110 and an insulating layer 120, and the conductive layers 110 and the insulating layers 120 are interlaced. The conductive layers 110 of the first stair contact structure 11 have a plurality of first contact points 110c1, the conductive layers 110 of the second stair contact structure 13 have a plurality of second contact points 110c2, the first contact points 110c1 and second contact points 110c2 are arranged respectively along a first direction D1 and a second direction D2 to form a first stair structure S1 and a second stair structure S2 having a plurality of stages, and the first direction D1 is different from the second direction D2.

In the embodiments, as shown in FIG. 3B, the conductive layers 110 in the first stair contact structure 11 have a plurality of lengths along the first direction D1, and the lengths of the conductive layers 110 increase downwards along the vertical direction VD1. In the embodiments, as shown in FIG. 3B, the conductive layers 110 in the second stair contact structure 13 have a plurality of lengths along the second direction D2, and the lengths of the conductive layers 110 increase downwards along the vertical direction VD1.

For example, as shown in FIG. 3B, the lengths L1a, L1b, L1c, L1d, L1e and L1f of the conductive layers 110 in the first stair contact structure 11 increase downwards along the vertical direction VD1, and the lengths L2a, L2b, L2c, L2d, L2e and L2f of the conductive layers 110 in the second stair contact structure 13 increase downwards along the vertical direction VD1.

In the embodiments, as shown in FIGS. 3A-3B, the conductive layers 110 of the first stair contact structure 11 have a plurality of first notches 130a-130e, the conductive layers 110 of the second stair contact structure 13 have a plurality of second notches 140a-140e, and the sizes of the first notches 130a-130e and the sizes of the second notches 140a-140e decrease downwards along the vertical direction VD1.

In the embodiments, as shown in FIGS. 3A-3B, the memory structure 2 may further include a plurality of conductive lines 400. Each conductive line 400 is correspondingly electrically connected to each first contact point 110c1 or each second contact point 110c2.

In some embodiments, referring to FIGS. 1, 2A and 2C, the first stair contact structure 11 of the memory structure 2 in the present embodiment may further include a first etch stop layer (not shown in FIGS. 3A-3B) as well, the first etch stop layer may penetrate through the stacking structures 100 of the first stair contact structure 11 vertically and extend along the first horizontal direction HD1, and the first contact points 110c1 are located at a first sidewall of the first etch stop layer, as shown in FIGS. 1, 2A and 2C.

In some other embodiments (not shown in FIGS. 3A-3B, referring to FIGS. 1, 2A and 2C, the first stair contact structure 11 of the memory structure 2 in the present embodiment may further include a second etch stop layer as well, the second stair contact structure 13 of the memory structure 2 in the present embodiment may also include a first etch stop layer and/or a second etch stop layer, and of which the arrangements can be referred to FIGS. 1, 2A and 2C and the description is omitted.

FIG. 4A to FIG. 18B show a flow chart of a manufacturing method of a memory structure including stair contact structures according to an embodiment of the present disclosure. The elements in the present embodiment sharing similar or the same labels with those in the previous embodiments are similar or the same elements, and the description of which is omitted.

Figure 4B:
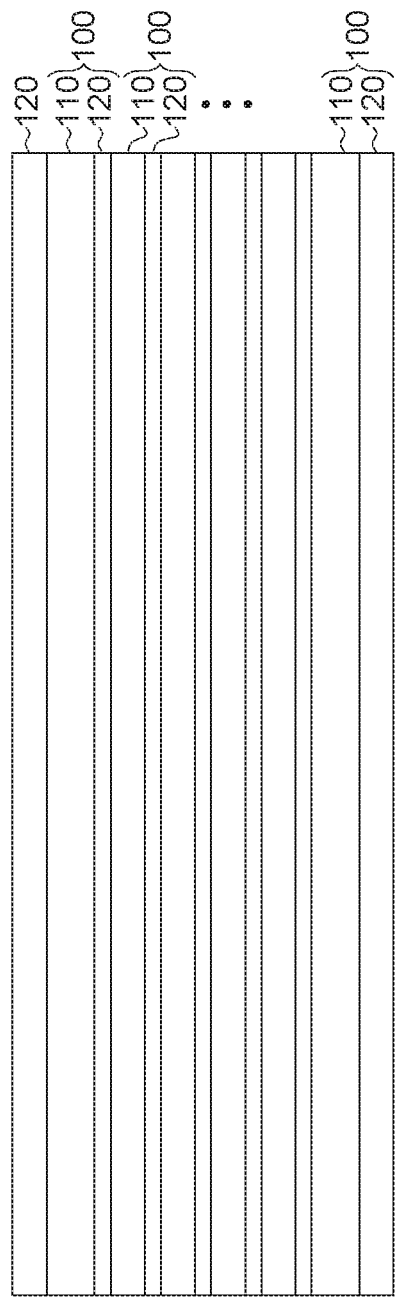

FIG. 4A shows a top view of the present step, and FIG. 4B shows a cross-sectional view along the cross-sectional line 4B-4B' in FIG. 4A. As shown in FIGS. 4A-4B, a plurality of layers of stacking structures 100 are formed, each stacking structure 100 includes a conductive layer 110 and an insulating layer 120, and the conductive layers 110 and the insulating layers 120 are interlaced.

Figure 5A:
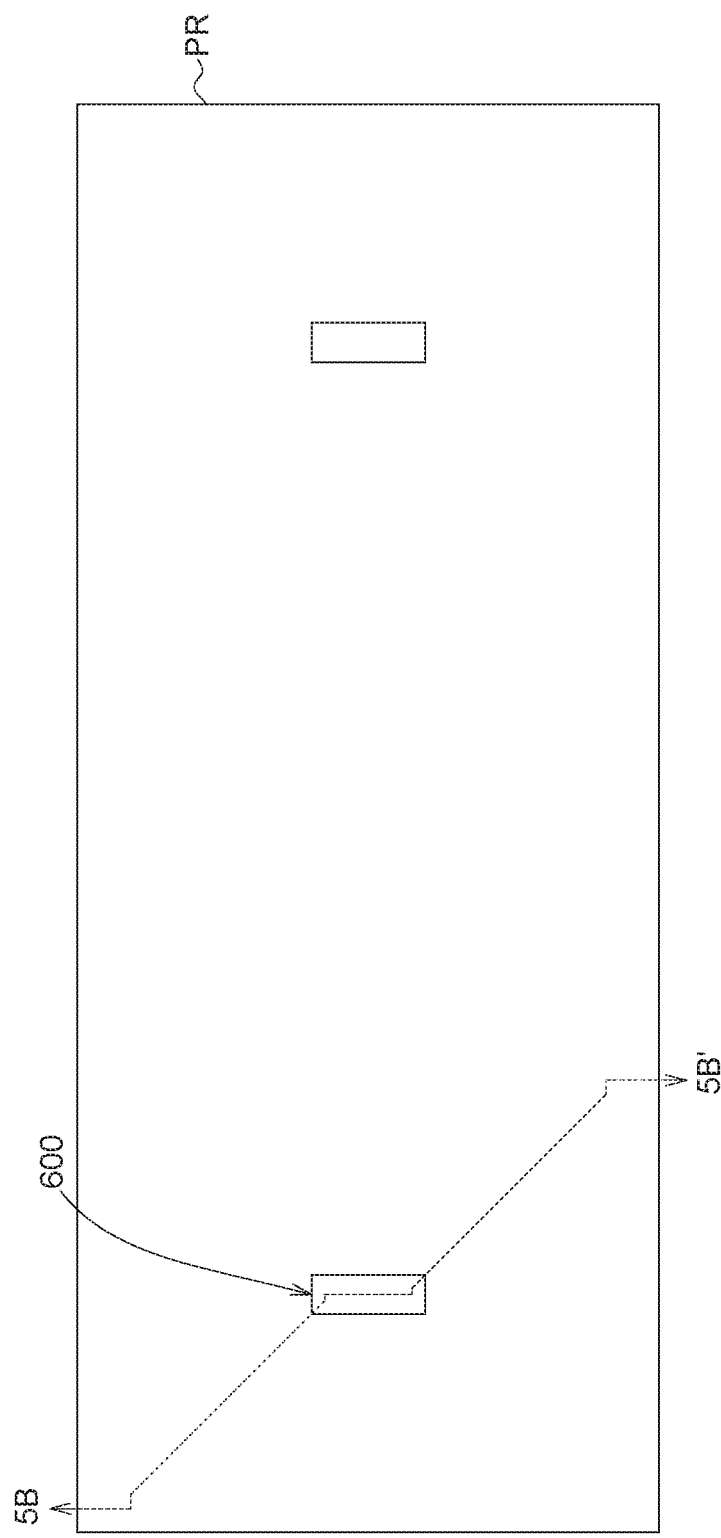
Figure 5B:
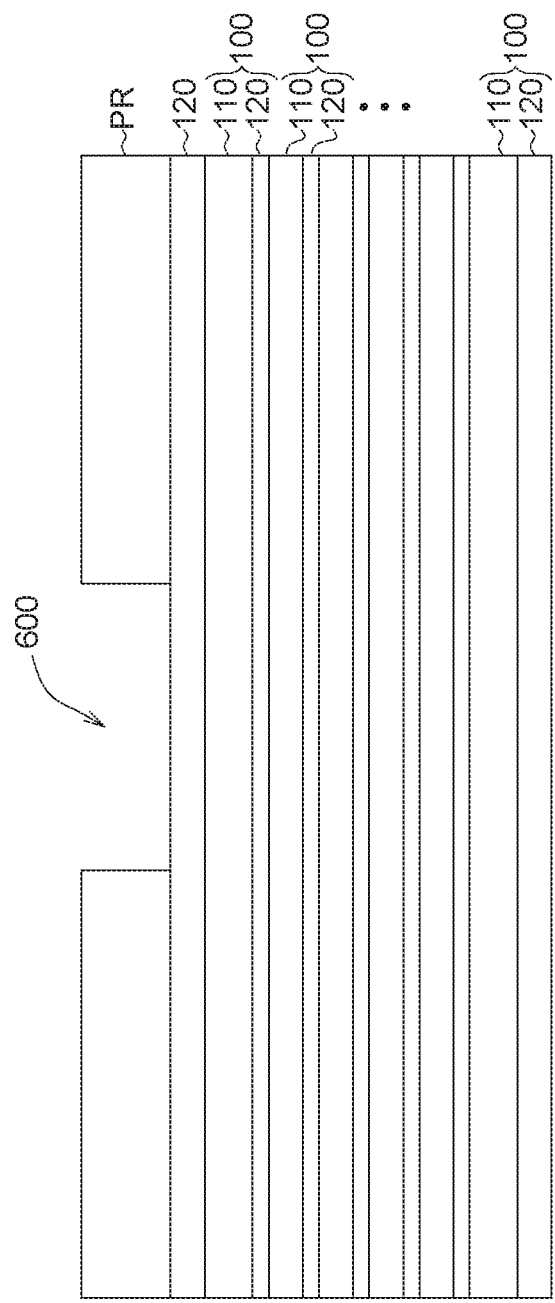

FIG. 5A shows a top view of the present step, and FIG. 5B shows a cross-sectional view along the cross-sectional line 5B-5B' in FIG. 5A. As shown in FIGS. 5A-5B, a patterned photoresist PR is formed on the stacking structures 100, and the patterned photoresist PR has an opening 600. In the embodiment, the opening 600 is located such as at the center of the cross-sectional line 5B-5B'.

Next, please refer to FIGS. 6A-16B, the stacking structures 100 are etched N times by using the patterned photoresist PR as a mask, and N is a positive integer. Each time of etching the stacking structures 100 includes performing a dry etching process on the stacking structures 100 and performing an isotropic etching process on the stacking structures 100. In etch time of performing the dry etching process on the stacking structures 100, a thickness of one layer of a portion of the stacking structures 100 is etched away, and in etch time of performing the isotropic etching process on the stacking structures 100, a width of one conductive layer 110 or multiple conductive layers 110 of the stacking structures 100 is trimmed off. The detailed manufacturing process includes such as the following steps.

Figure 6B:
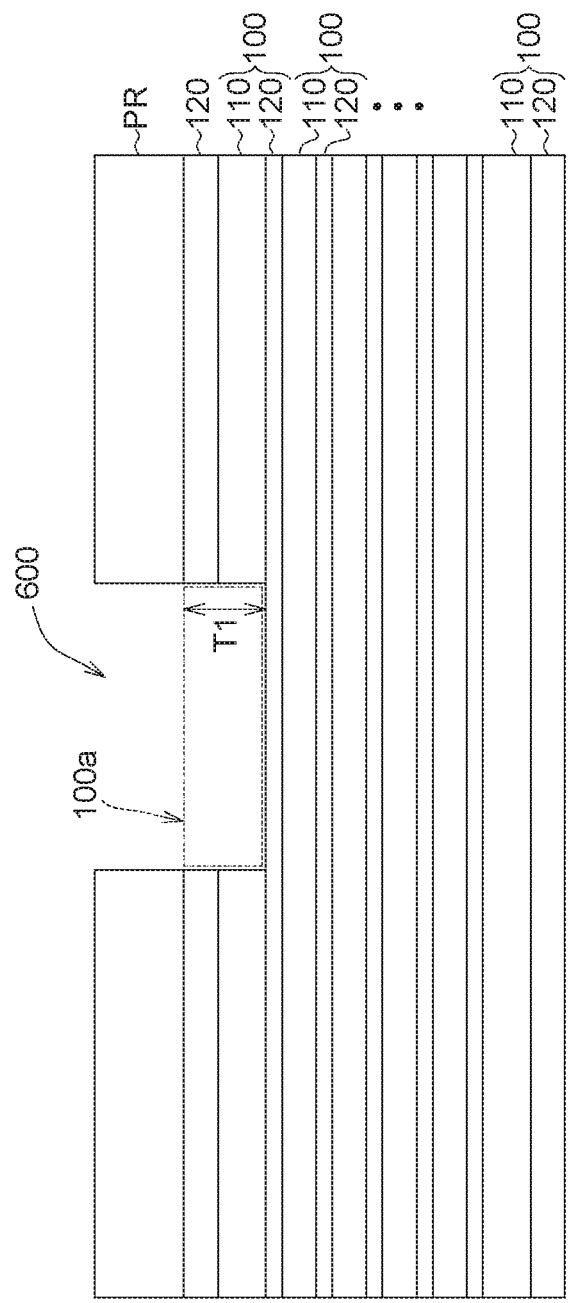

FIG. 6A shows a top view of the present step, and FIG. 6B shows a cross-sectional view along the cross-sectional line 6B-6B' in FIG. 6A. As shown in FIGS. 6A-6B, a dry etching process is performed on the stacking structures 100 by using the patterned photoresist PR as a mask, and a thickness T1 of one layer is etched away. As shown in FIGS. 6A-6B, an area of the region 100a of the portion of the stacking structures 100 of which a thickness T1 of one layer is etched away is substantially the same with an area of the opening 600 of the patterned photoresist PR. The term "substantially the same" indicates almost or approximately the same and may include size variance within the manufacturing processing tolerance.

Figure 7B:
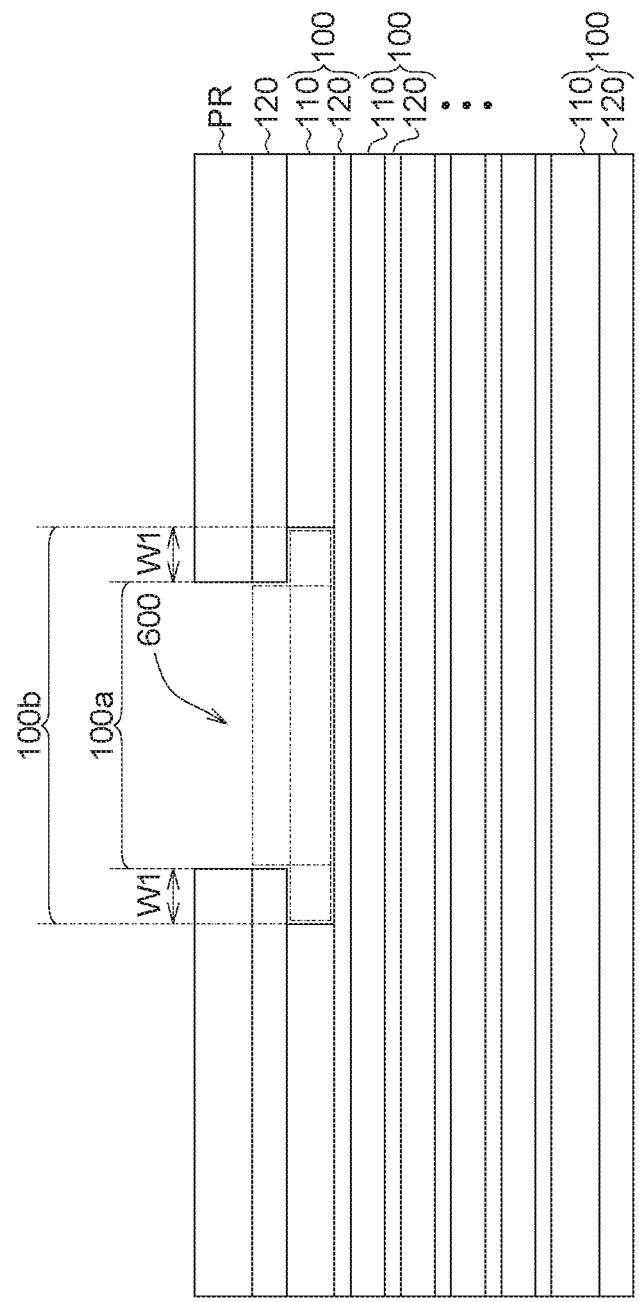

FIG. 7A shows a top view of the present step, and FIG. 7B shows a cross-sectional view along the cross-sectional line 7B-7B' in FIG. 7A. As shown in FIGS. 7A-7B, an isotropic etching process is performed on the stacking structures 100 by using the patterned photoresist PR as a mask to trim off a width W1 of one conductive layer 110 or multiple conductive layers 110 of the stacking structures 100. In the embodiments, the isotropic etching process provides a high etching selectivity of the material of the conductive layers 110 to the material of the insulating layers 120; that is, only the conductive layers 110 are partially laterally etched, and the insulating layers 120 are not etched, such that the insulating layers 120 are provided with effects of etching protection for protecting other conductive layers 110 located underneath from being damaged by the isotropic etching process, and only the exposed conductive layers 110 are laterally partially etched away. The laterally etched conductive layers 110 have an opening, and the region 100b of the opening is equal to the enlarged range of the aforementioned region 100a extended outwards omnidirectionally by a width W1. In the embodiments, the isotropic etching process may be a dry etching process or a wet etching process.

In the embodiments, after every time the stacking structures 100 is etched, the thickness of the patterned photoresist PR may be reduced by the consumption from the etching process. As shown in FIGS. 6B and 7B, the patterned photoresist PR is apparently thinned.

As shown in FIGS. 6A-7B, one time of etching the stacking structures 100 by using the patterned photoresist PR as a mask is completed (i.e. one time of the dry etching process plus one time of the isotropic etching process), and the aforementioned N equals to 1. Below the step of etching the stacking structures 100 will repeat multiple times.

FIG. 8A shows a top view of the present step, and FIG. 8B shows a cross-sectional view along the cross-sectional line 8B-8B' in FIG. 8A. As shown in FIGS. 8A-8B, a dry etching process is performed on the stacking structures 100 by using the patterned photoresist PR as a mask, and a thickness T1 of one layer is etched away. In the present embodiment, the same thickness T1 being etched away in each time of the dry etching process is taken as an example; in other embodiments, the thicknesses etched away by multiple dry etching processes can be different and varied/adjusted according to actual needs.

Figure 9B:
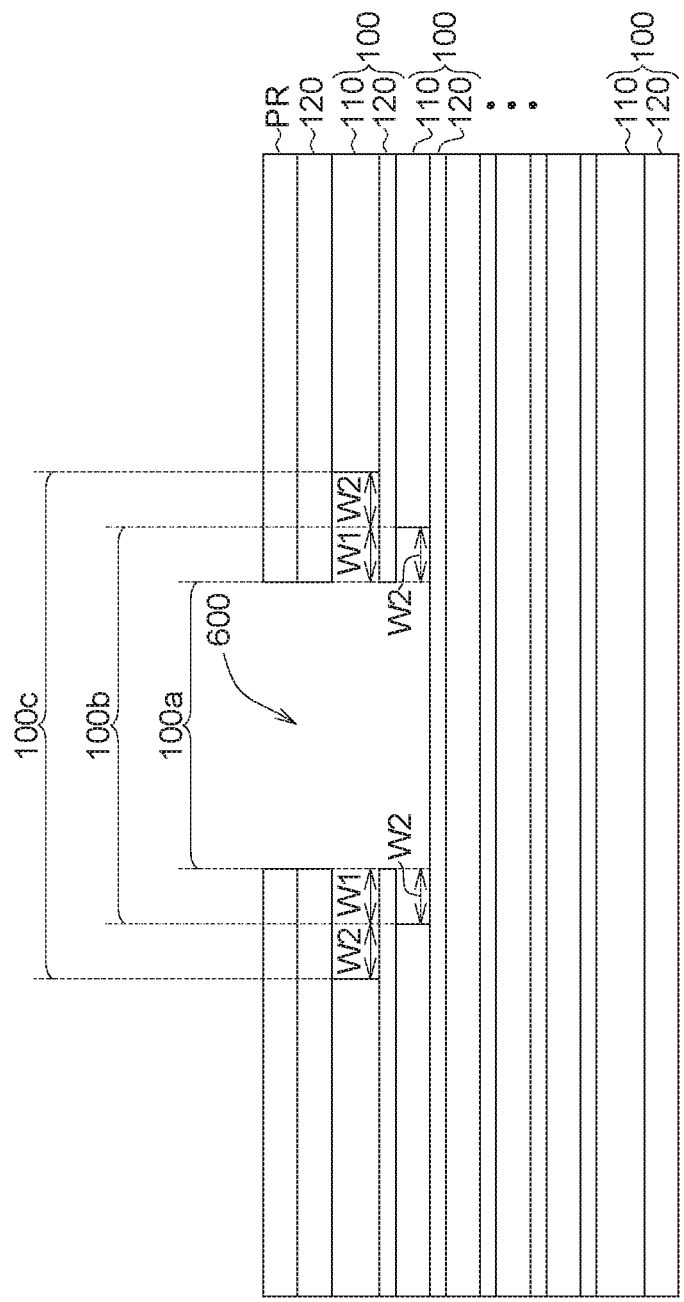

FIG. 9A shows a top view of the present step, and FIG. 9B shows a cross-sectional view along the cross-sectional line 9B-9B' in FIG. 9A. As shown in FIGS. 9A-9B, an isotropic etching process is performed on the stacking structures 100 by using the patterned photoresist PR as a mask, and a width W2 of two conductive layers 110 of the stacking structures 100 is trimmed off. In the embodiments, the width W2 may be the same with or different from the width W2 trimmed off in the previous isotropic etching process. The two conductive layers 110 laterally etched both have openings; the opening of the conductive layer 110 laterally etched one time has the region 100b, the opening of the conductive layer 110 laterally etched two times has a region 100c, and the region 100c is equal to the enlarged range of the aforementioned region 100b extended outwards omnidirectionally by a width W2.

As shown in FIGS. 8A-9B, two times of etching the stacking structures 100 by using the patterned photoresist PR as a mask are completed, and the aforementioned N equals to 2. In addition, as shown in FIGS. 8B and 9B, the patterned photoresist PR is apparently further thinned.

Figure 10A:
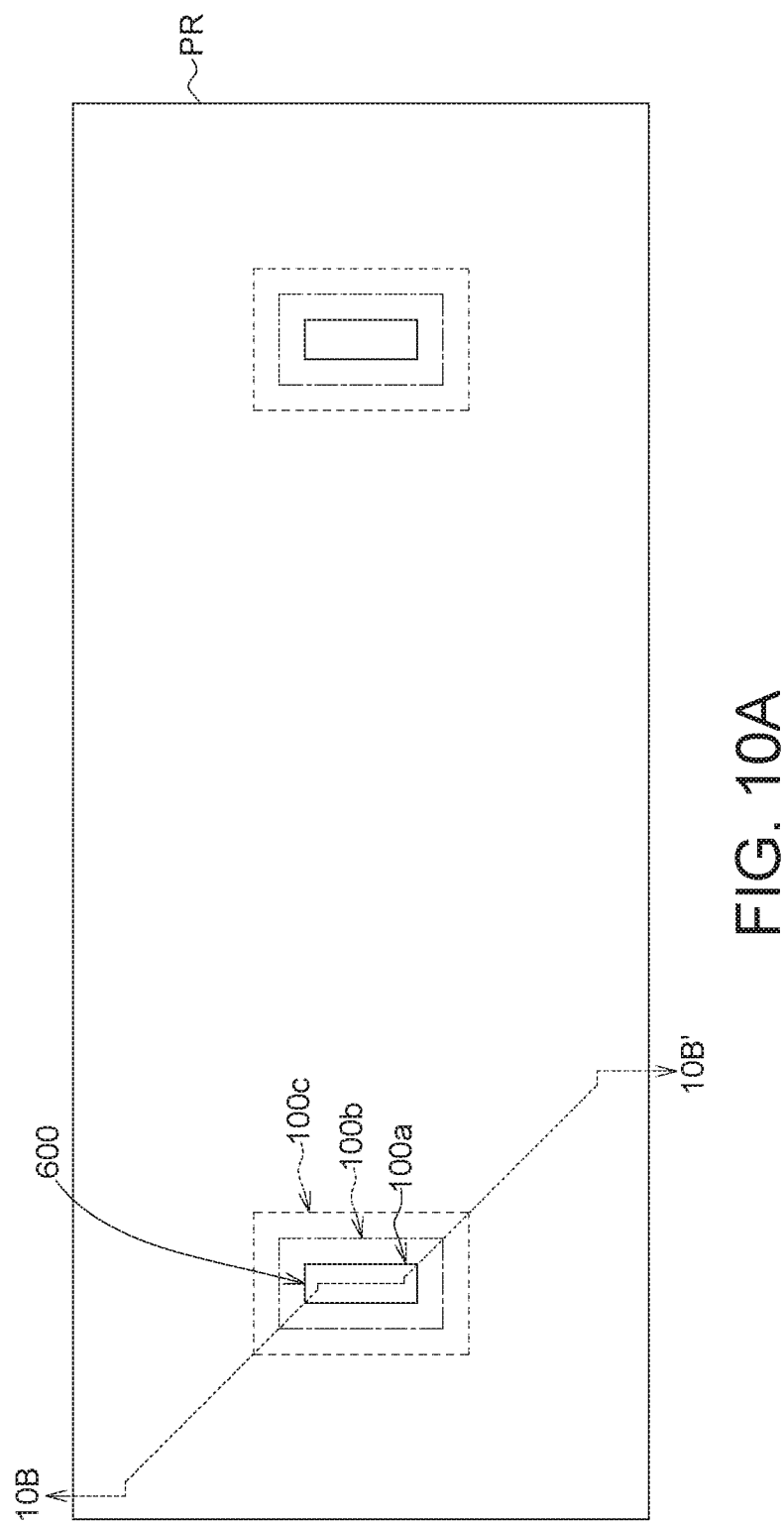
Figure 10B:
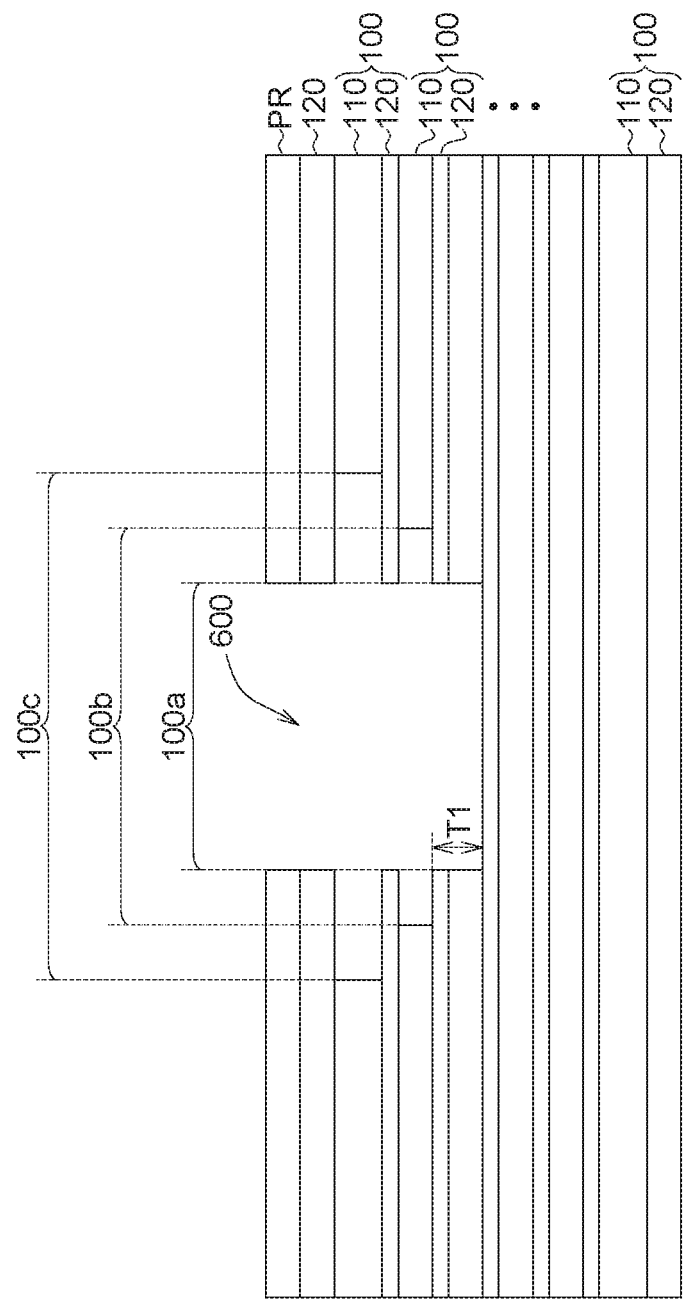

FIG. 10A shows a top view of the present step, and FIG. 10B shows a cross-sectional view along the cross-sectional line 10B-10B' in FIG. 10A. As shown in FIGS. 10A-10B, a dry etching process is performed on the stacking structures 100 by using the patterned photoresist PR as a mask, and a thickness T1 of one layer is etched away.

Figure 11A:
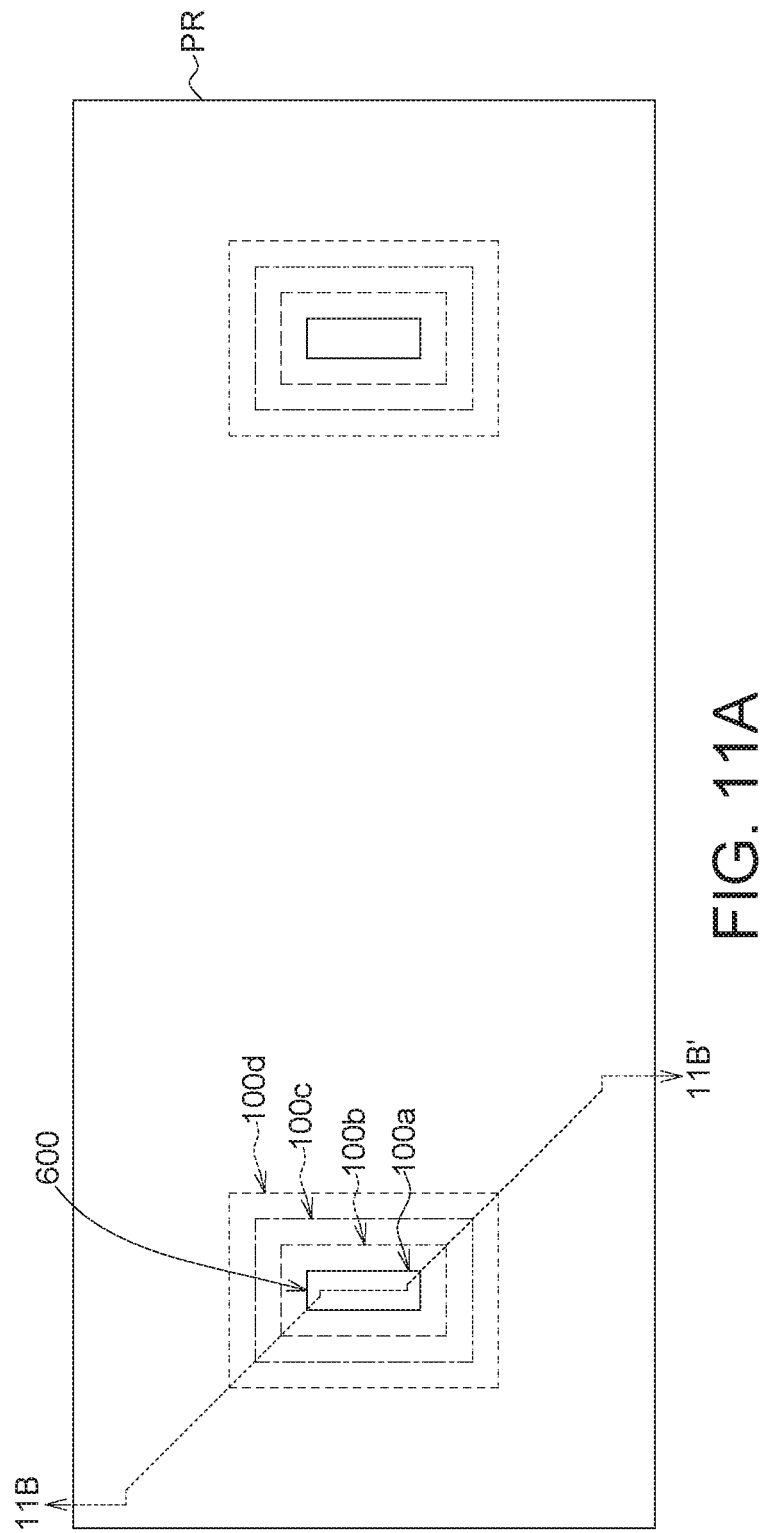
Figure 11B:
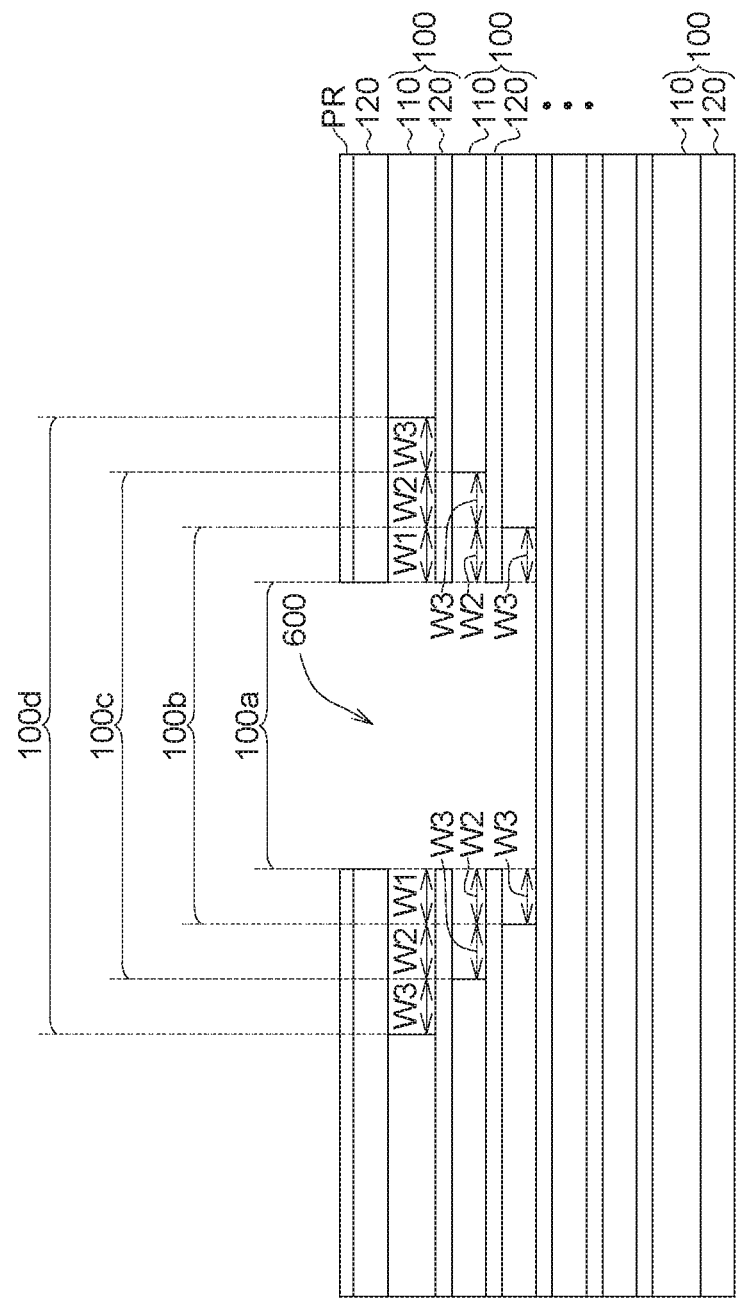

FIG. 11A shows a top view of the present step, and FIG. 11B shows a cross-sectional view along the cross-sectional line 11B-11B' in FIG. 11A. As shown in FIGS. 11A-11B, an isotropic etching process is performed on the stacking structures 100 by using the patterned photoresist PR as a mask, and a width W3 of three conductive layers 110 of the stacking structures 100 is trimmed off. The three conductive layers 110 laterally etched all have openings; the opening of the conductive layer 110 laterally etched one time has the region 100b, the opening of the conductive layer 110 laterally etched two times has the region 100c, the opening of the conductive layer 110 laterally etched three times has a region 100d, and the region 100d is equal to the enlarged range of the aforementioned region 100c extended outwards omnidirectionally by a width W3.

As shown in FIGS. 10B and 11B, the patterned photoresist PR is apparently further thinned. In some embodiments, after etching every M times the stacking structures 100, M being a positive integer and smaller than N (i.e. the manufacturing process is not fully completed), the thickness of the patterned photoresist PR is thinned. The manufacturing method according to the present disclosure may further include the following steps: forming a supplementary patterned photoresist on the stacking structures 100, the pattern of the supplementary patterned photoresist is the same as the pattern of the original patterned photoresist PR, and the supplementary patterned photoresist is disposed on the original patterned photoresist PR.

Figure 12A:
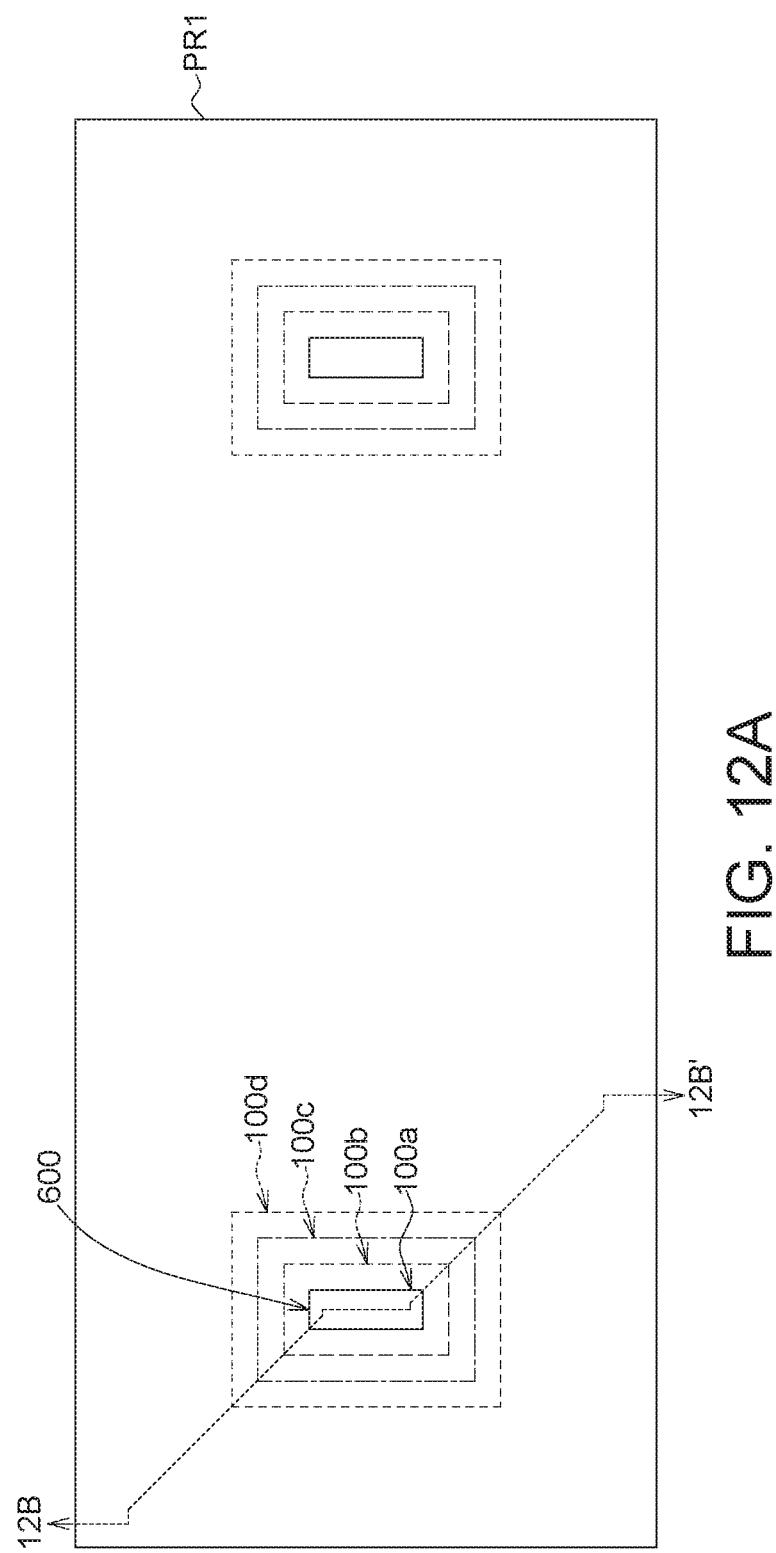

For example, as shown in FIGS. 12A-12B (FIG. 12A shows a top view of the present step, and FIG. 12B shows a cross-sectional view along the cross-sectional line 12B-12B' in FIG. 12A), the supplementary patterned photoresist PR1 is disposed on the stacking structures 100, the pattern of the supplementary patterned photoresist PR is the same as the pattern of the patterned photoresist PR, and the supplementary patterned photoresist PR1 is disposed on the original patterned photoresist PR. In the present embodiment, the supplementary patterned photoresist being formed after the stacking structures 100 being etched three times (M=3) is taken as an example; however, the value of M can be larger than 3, for example, 5 to 10, but the present disclosure is not limited thereto.

Figure 13A:
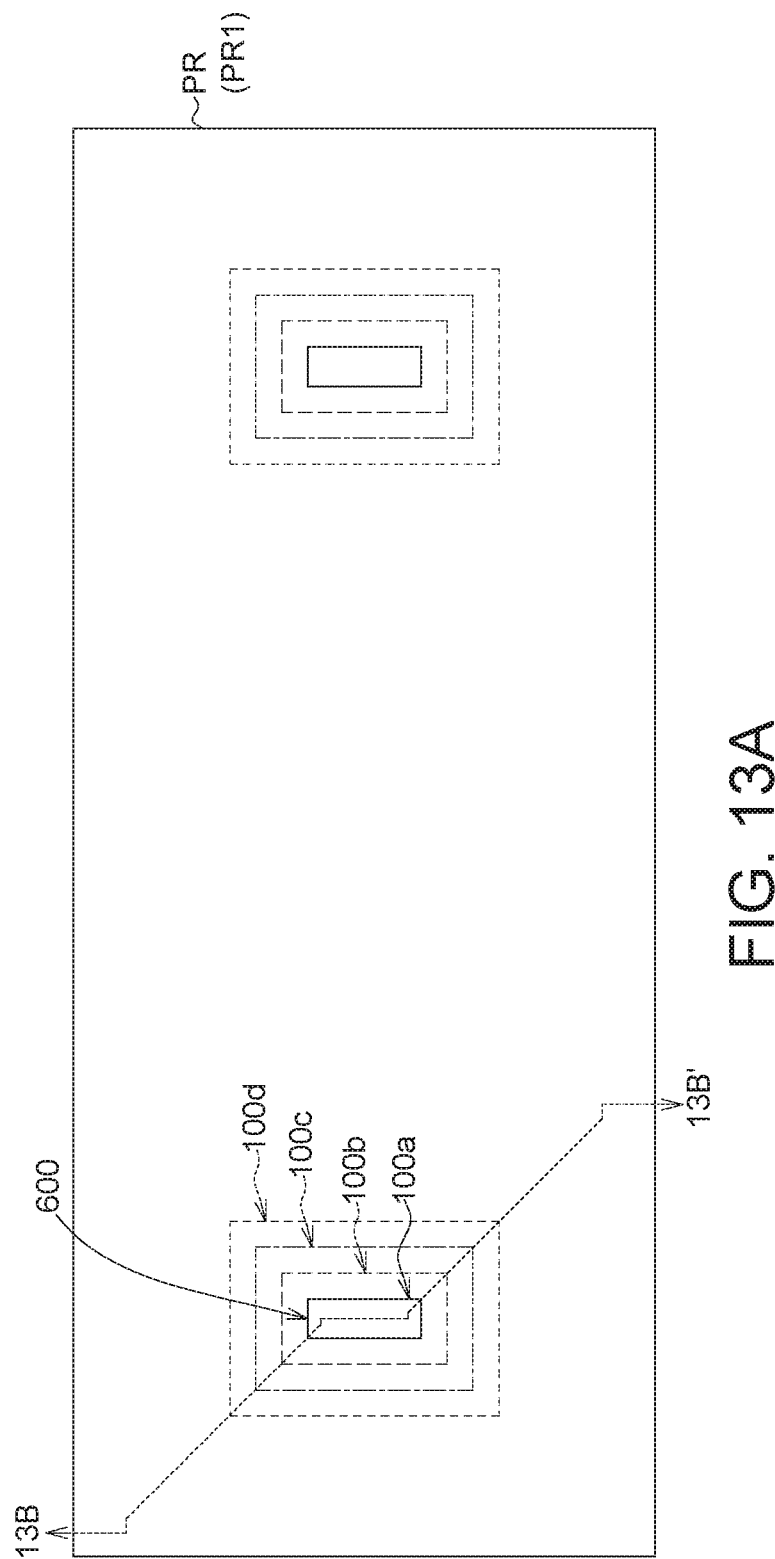
Figure 13B:
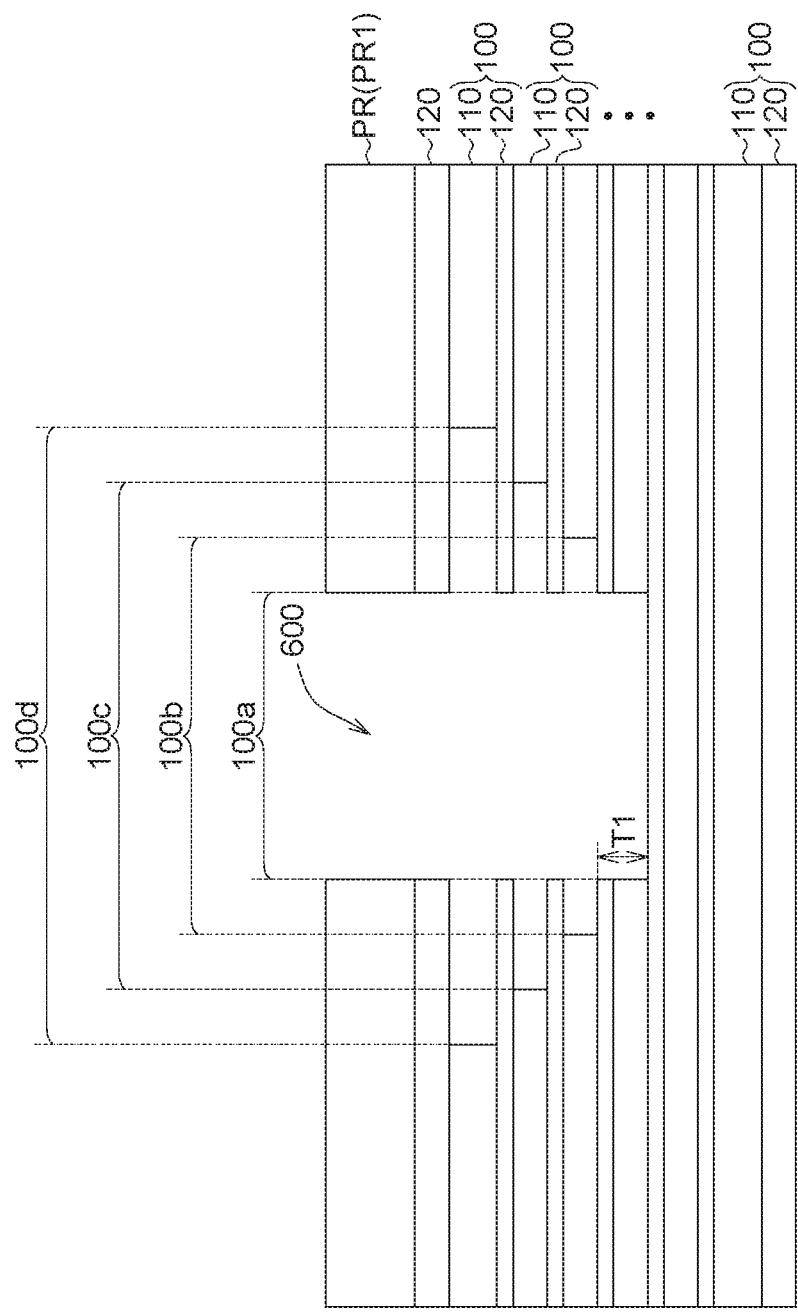
Figure 14A:
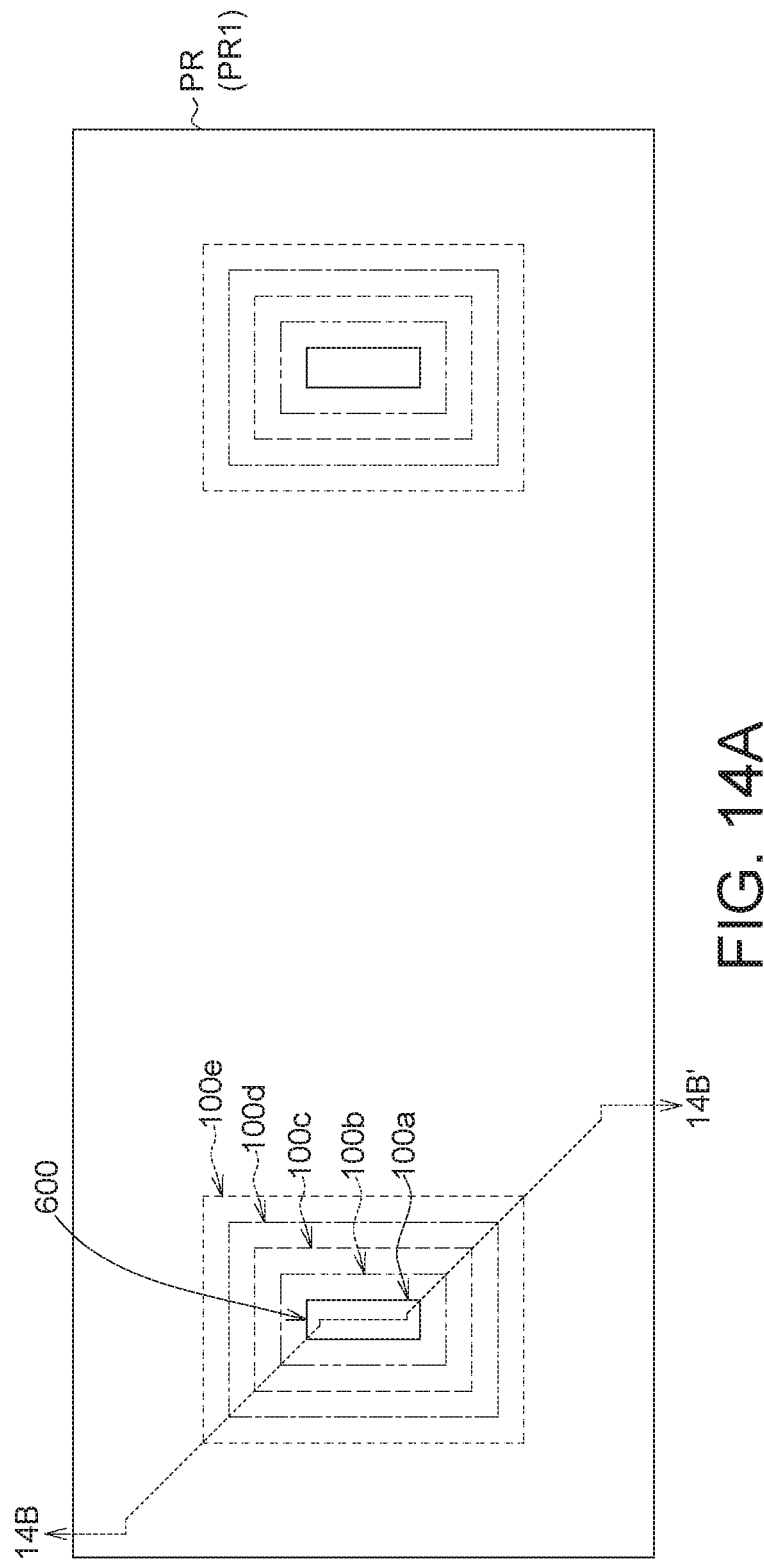
Figure 14B:
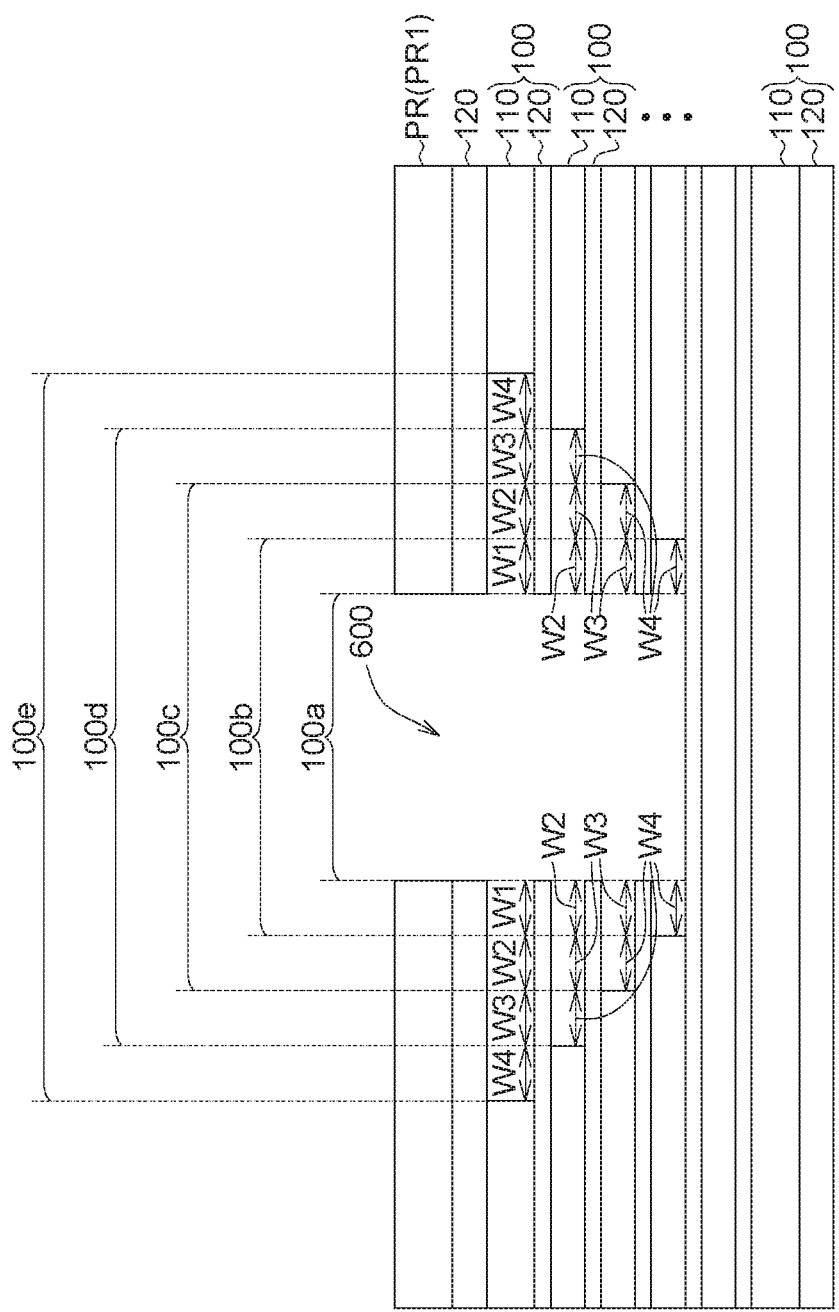

FIG. 13A shows a top view of the present step, and FIG. 13B shows a cross-sectional view along the cross-sectional line 13B-13B' in FIG. 13A. As shown in FIGS. 13A-13B, a dry etching process is performed on the stacking structures 100 by using the patterned photoresist PR and optionally the supplementary patterned photoresist PR1 having the same pattern with that of the patterned photoresist PR as a mask, and a thickness T1 of one layer is etched away.

FIG. 13A shows a top view of the present step, and FIG. 13B shows a cross-sectional view along the cross-sectional line 13B-13B' in FIG. 13A. As shown in FIGS. 13A-13B, an isotropic etching process is performed on the stacking structures 100 by using the patterned photoresist PR (and the supplementary patterned photoresist PR1 having the same pattern with that of the patterned photoresist PR) as a mask, and a width W4 of four conductive layers 110 of the stacking structures 100 is trimmed off. The four conductive layers 110 laterally etched all have openings; the opening of the conductive layer 110 laterally etched one time has the region 100b, the opening of the conductive layer 110 laterally etched two times has the region 100c, the opening of the conductive layer 110 laterally etched three times has the region 100d, the opening of the conductive layer 110 laterally etched four times has a region 100e, and the region 100e is equal to the enlarged range of the aforementioned region 100d extended outwards omnidirectionally by a width W4.

Figure 15A:
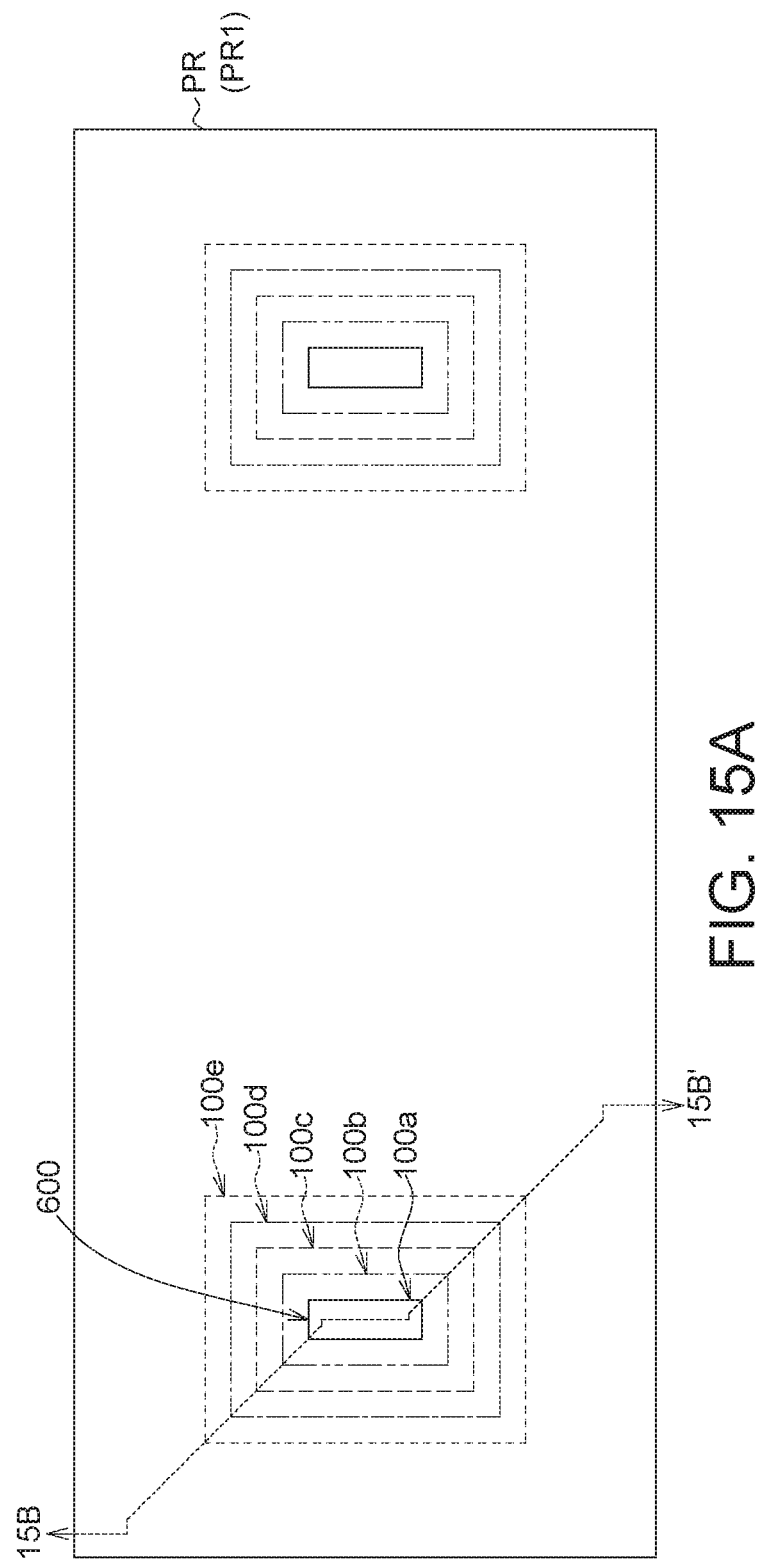

FIG. 15A shows a top view of the present step, and FIG. 15B shows a cross-sectional view along the cross-sectional line 15B-15B' in FIG. 15A. As shown in FIGS. 15A-15B, a dry etching process is performed on the stacking structures 100 by using the patterned photoresist PR and optionally the supplementary patterned photoresist PR1 having the same pattern with that of the patterned photoresist PR as a mask, and a thickness T1 of one layer is etched away.

In the present disclosure, the stacking structures 100 being etched four times (N=4) is taken as an example; however, the value of N may be larger than 4, and the present disclosure is not limited thereto.

Figure 16B:
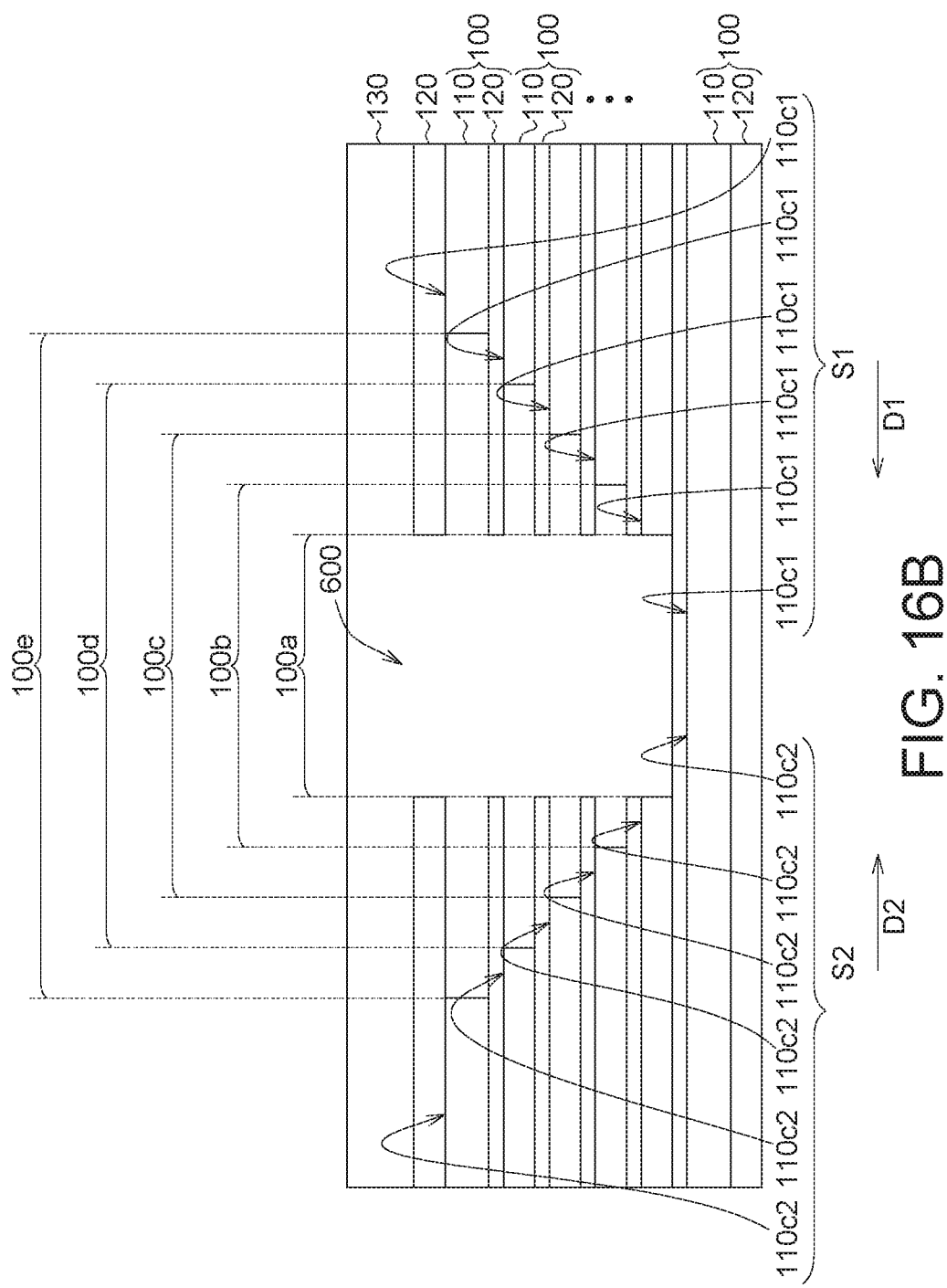

As shown in FIGS. 16A-16B (FIG. 16A shows a top view of the present step, and FIG. 16B shows a cross-sectional view along the cross-sectional line 16B-16B' in FIG. 16A), the patterned photoresist PR is removed. The patterned photoresist being removed herein indicates the original patterned photoresist PR and one or more than one supplementary patterned photoresists formed in the manufacturing process. In addition, as shown in FIGS. 16A-16B, an insulating layer 130 is formed on the stacking structures 100 and filled in the space between the insulating layers 120. The materials of the insulating layers 120 and the insulating layer 130 may be the same or different, and the structure of the insulating layers 120 are represented by dashed lines in FIG. 16B.

As shown in FIGS. 16A-16B, the conductive layers 110 of the stacking structures 100 have multiple contact points, and these contact points are arranged along a horizontal direction to form a stair structure having a plurality of stages. For example, the first contact points 110c1 are arranged along a first direction D1 to form a first stair structure S1 having a plurality of stages, and the second contact points 110c2 are arranged along a second direction D2 to form a second stair structure S2 having a plurality of stages.

Figure 17A:
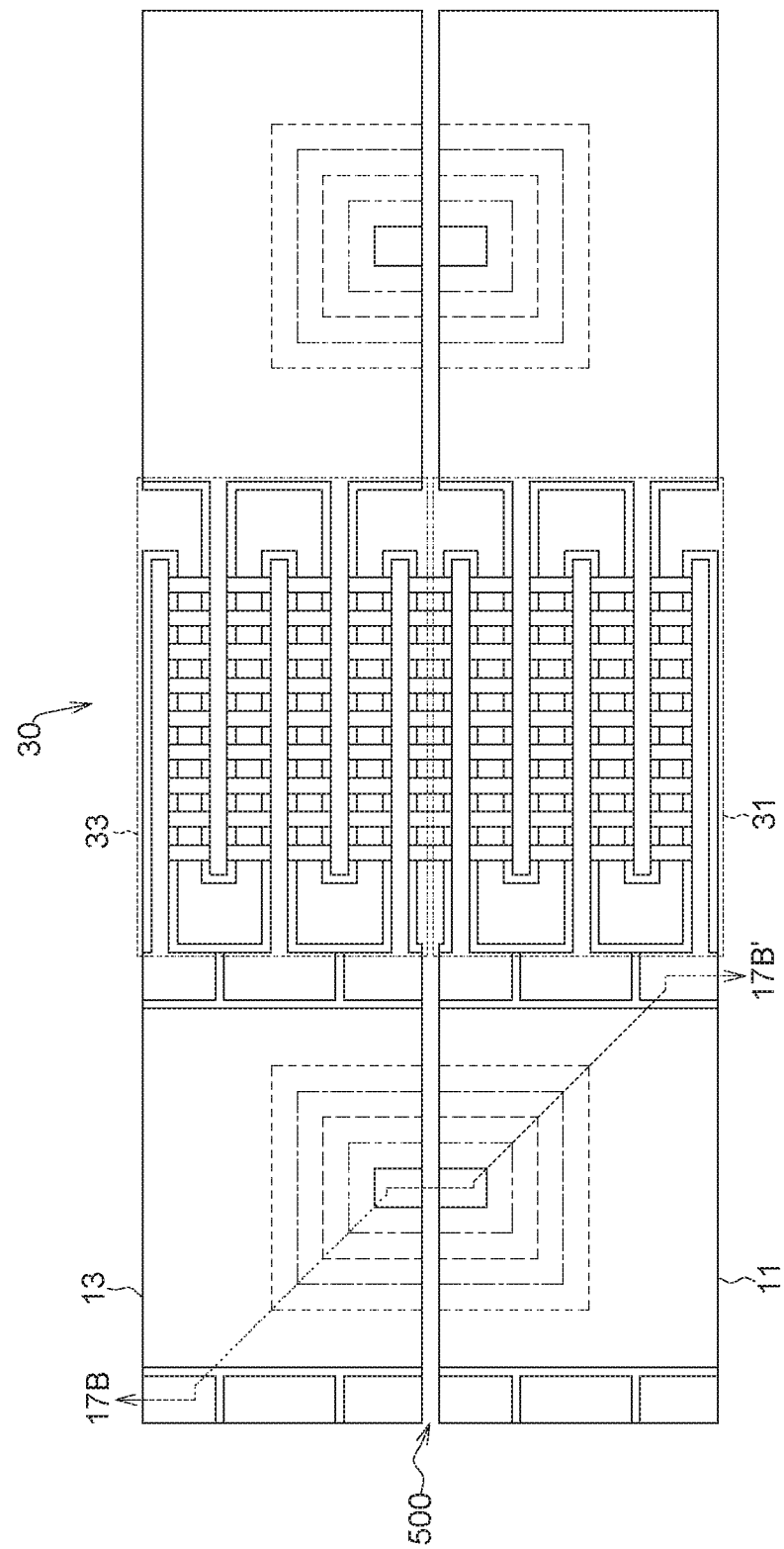
Figure 17B:
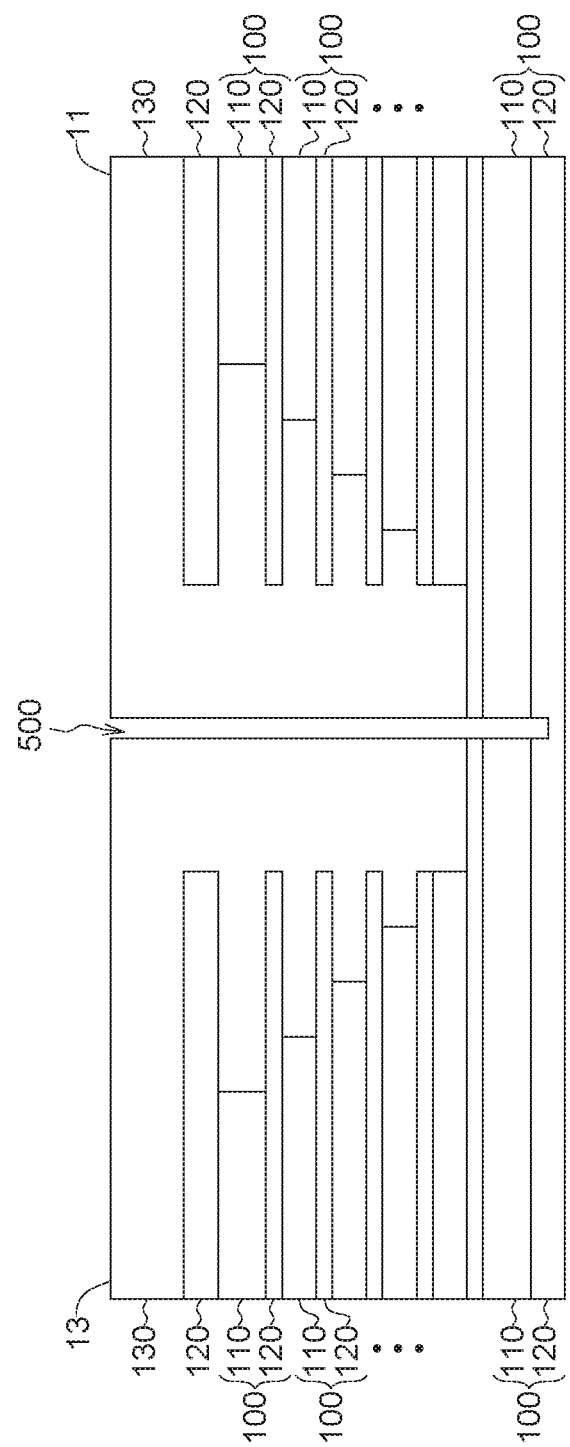

Next, as shown in FIGS. 17A-17B (FIG. 17A shows a top view of the present step, and FIG. 17B shows a cross-sectional view along the cross-sectional line 17B-17B' in FIG. 17A), a memory array 30 is manufactured. In the embodiments, the memory array 30 may include two memory blocks 31 and 33.

As shown in FIGS. 17A-17B, the stacking structures 100 are etched for forming a trench 500, and the trench 500 separates the stacking structures 100 into two separate contact structures, for example, the first stair contact structure 11 and the second stair contact structure 13, and the first stair contact structure 11 and the second stair contact structure 13 are respectively electrically connected to the memory block 31 and the memory block 33. According to the embodiments of the present disclosure, the whole stair structure formed by the aforementioned N times of etching processes is further divided into two separate stair contact structures by the trench 500, such that two stair contact structures that can be respectively electrically connected to two separate memory blocks can be formed in one manufacturing process; as such, the manufacturing process can be simplified, the area of the region occupied by one stair contact structure can be reduced, and meanwhile one stair contact structure can be correspondingly electrically connected to a smaller memory block, which can reduce the number of memory units in one erase operation.

Figure 18A:
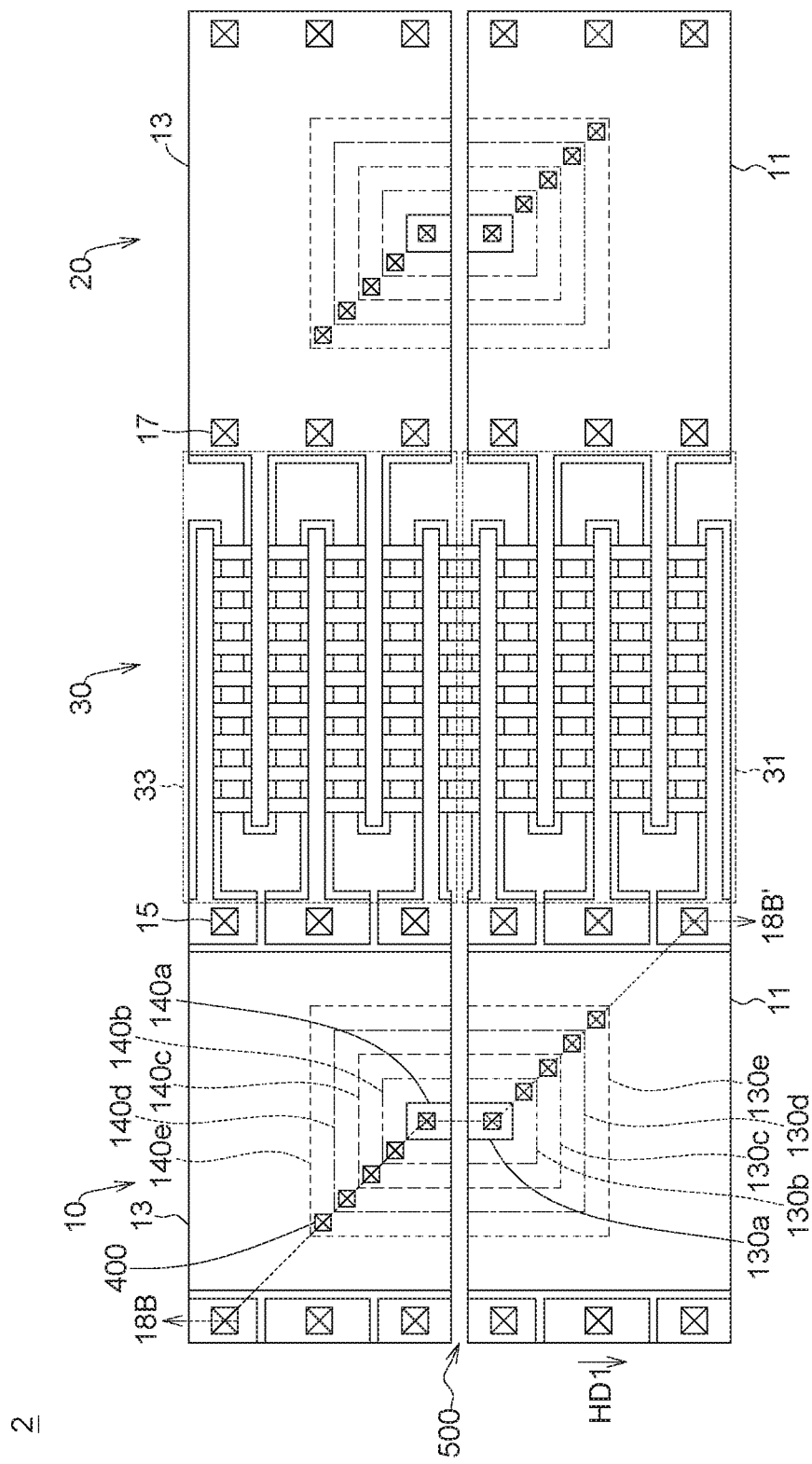
Figure 18B:
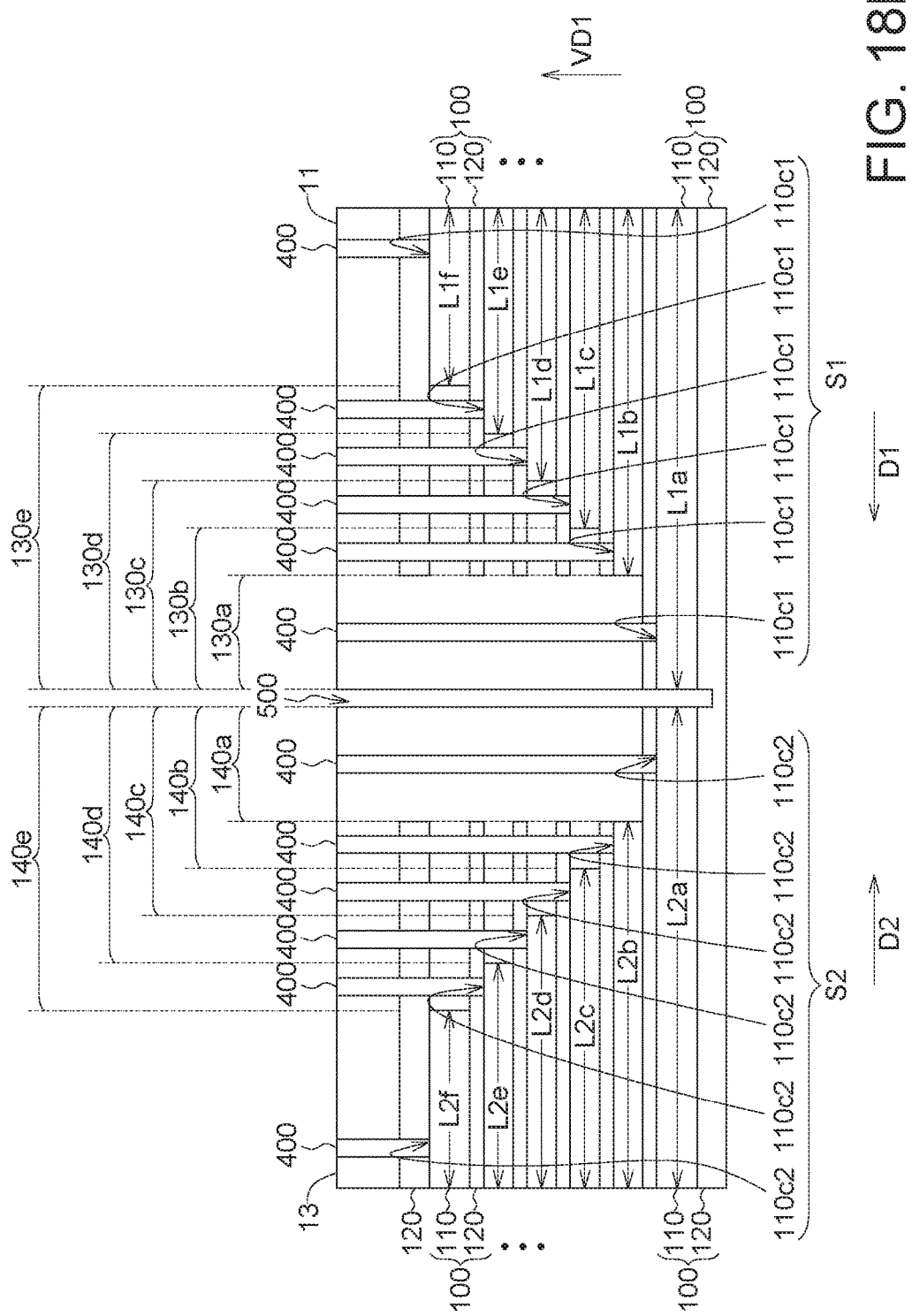

Next, as shown in FIGS. 18A-18B (FIG. 18A shows a top view of the present step, and FIG. 18B shows a cross-sectional view along the cross-sectional line 18B-18B' in FIG. 18A), a plurality of conductive lines 400 are disposed, and each conductive line 400 is electrically connected to each contact point 110c1/110c2. As such, the memory structure 2 and of which the stair contact structures as shown in FIGS. 3A-3B is formed.

In conventional manufacturing process, the formation of each contact point located in each different level (stage) requires a photo mask step and an etching process, thus the manufacturing process is more complex and difficult, and a higher manufacturing cost is required. On the contrary, according to the embodiments of the present disclosure, the stair contact structure can be made by multiple etching processes with fewer mask steps, such that the manufacturing process is simplified, costs are reduced, and the manufacturing time is reduced; in addition, the manufacturing process of the present disclosure can be integrated into the existing semiconductor manufacturing process, thereby can be applied in the manufacturing processes for various 3D high-density memory devices.

FIG. 19 to FIG. 25B show a flow chart of a manufacturing method of a memory structure including stair contact structures according to another embodiment of the present disclosure. The elements in the present embodiment sharing similar or the same labels with those in the previous embodiment are similar or the same elements, and the description of which is omitted. It is to be noted that the present embodiment describes the manufacturing method of one stair contact structure of the memory structure as shown in FIGS. 1 and 2A-2D.

Figure 19:
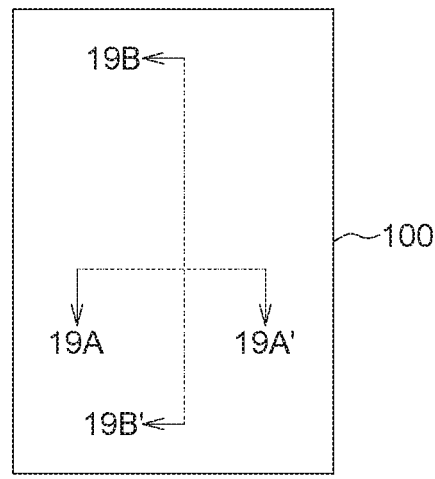
FIG. 19 to FIG. 25B show a flow chart of a manufacturing method of a memory structure including stair contact structures according to another embodiment of the present disclosure.
Figure 19A:
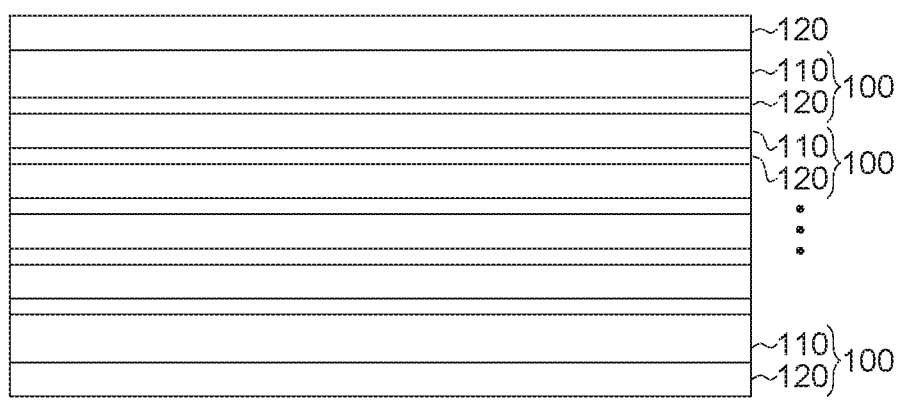
Figure 19B:
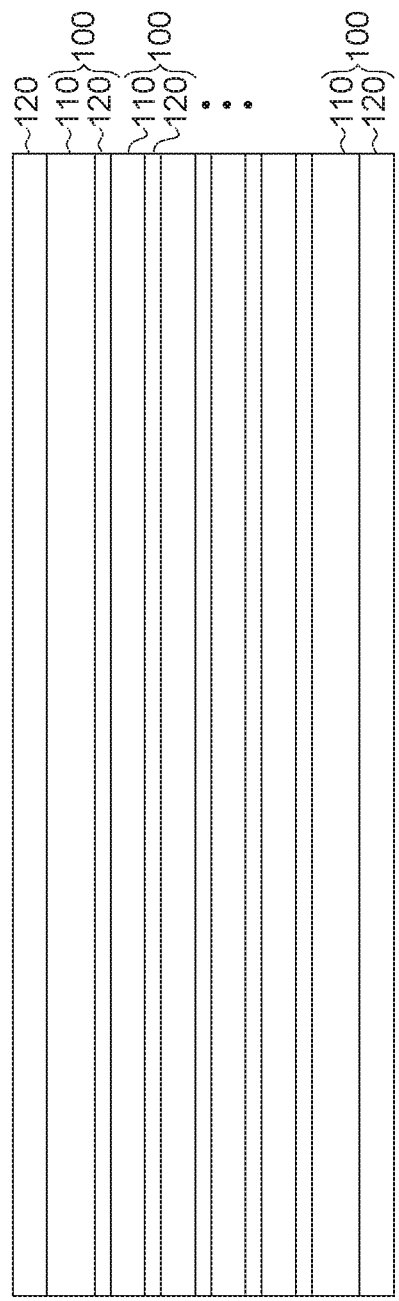

FIG. 19 shows a top view of the present step, FIG. 19A shows a cross-sectional view along the cross-sectional line 19A-19A' in FIG. 19, and FIG. 19B shows a cross-sectional view along the cross-sectional line 19B-19B' in FIG. 19. As shown in FIGS. 19-19B, a plurality of stacking structures 100 are formed, each stacking structure 100 includes a conductive layer 110 and an insulating layer 120, and the conductive layers 110 and the insulating layers 120 are interlaced.

Figure 20:
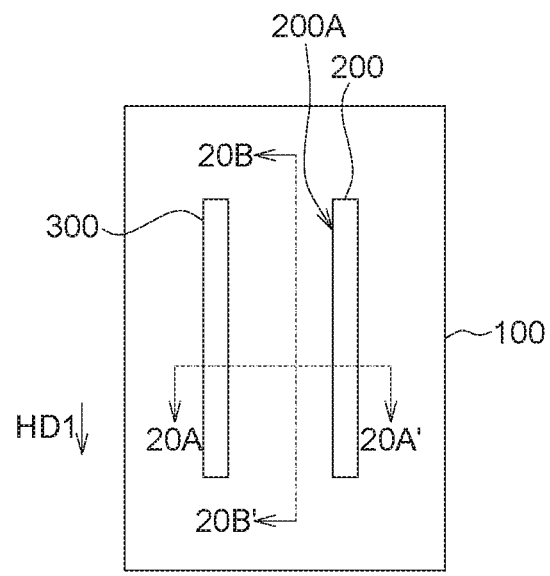
Figure 20A:
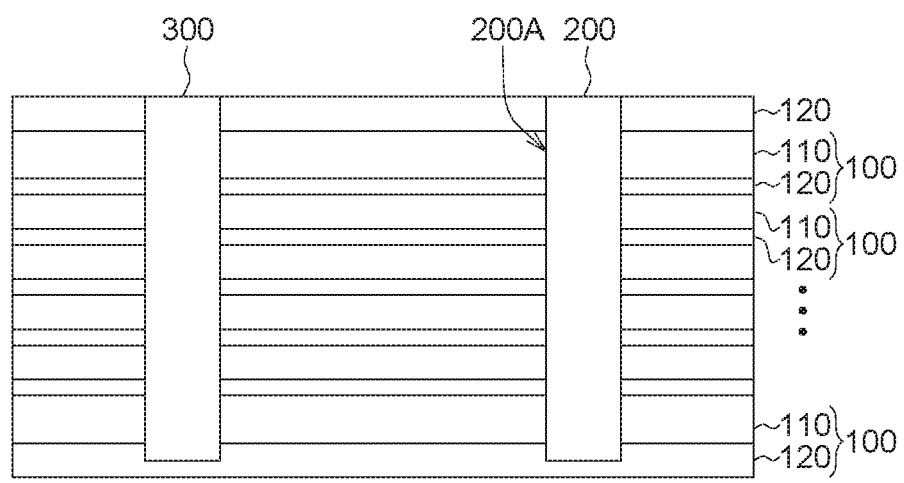
Figure 20B:
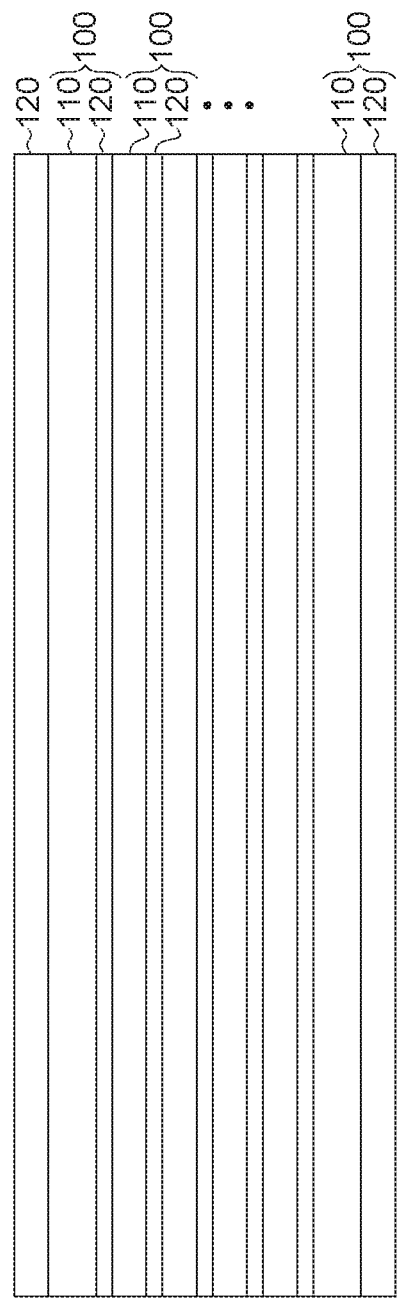

Next, as shown in FIGS. 20-20B (FIG. 20 shows a top view of the present step, FIG. 20A shows a cross-sectional view along the cross-sectional line 20A-20A' in FIG. 20, and FIG. 20B shows a cross-sectional view along the cross-sectional line 20B-20B' in FIG. 20), before forming the patterned photoresist PR on the stacking structures 100, a first etch stop layer 200 is formed, the first etch stop layer 200 penetrates through the stacking structures 100 vertically and extends along a first horizontal direction HD1, and the first etch stop layer 200 has a first sidewall 200A.

As shown in FIGS. 20-20B, before forming the patterned photoresist PR on the stacking structures 100, a second etch stop layer 300 may be further formed, and the second etch stop layer 300 penetrates through the stacking structures 100 vertically and extends along the first horizontal direction HD1.

Figure 21:
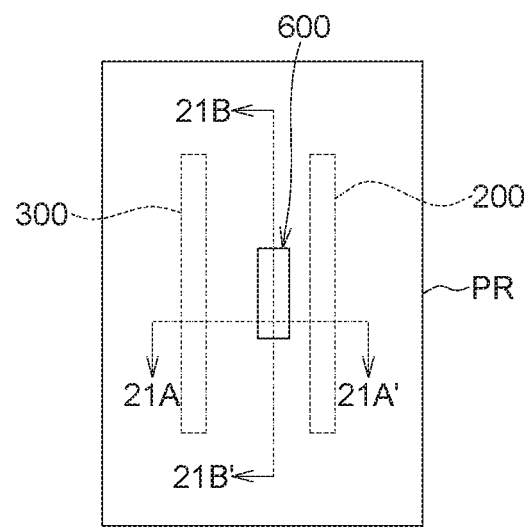
Figure 21A:
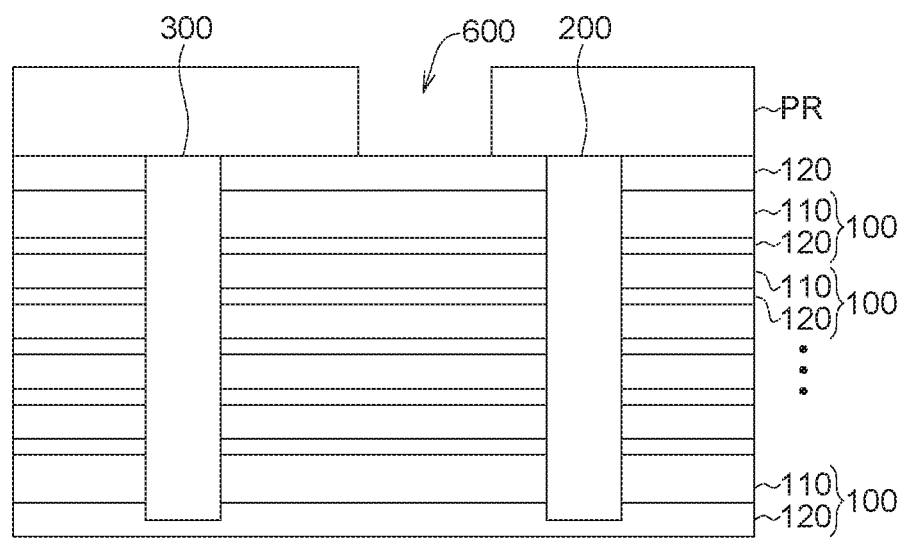
Figure 21B:
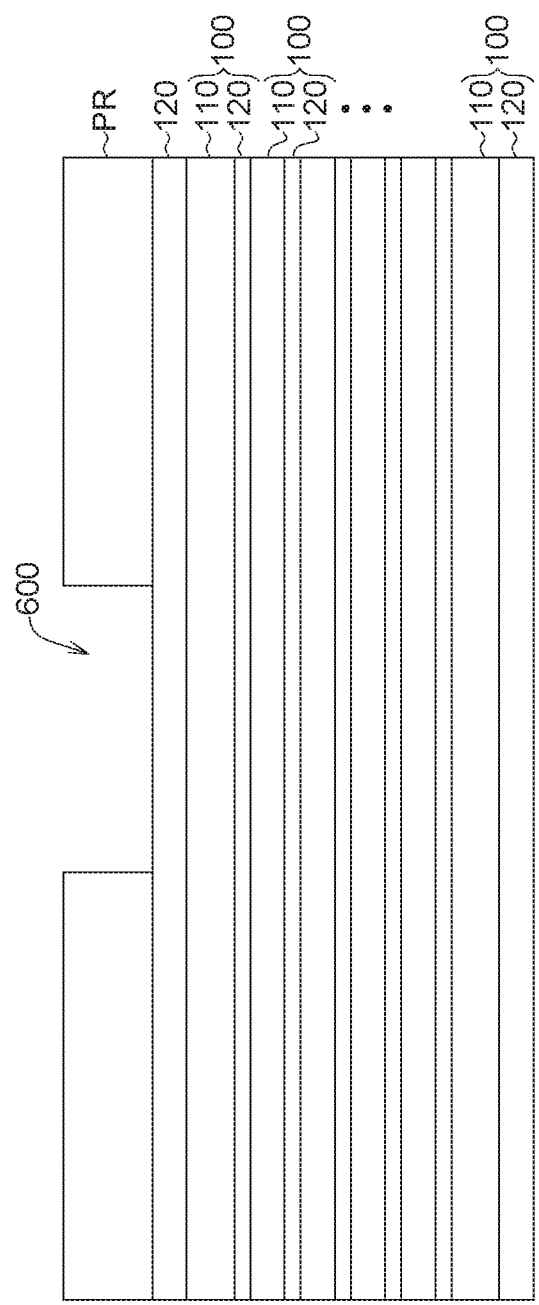

Next, as shown in FIGS. 21-21B (FIG. 21 shows a top view of the present step, FIG. 21A shows a cross-sectional view along the cross-sectional line 21A-21A' in FIG. 21, and FIG. 21B shows a cross-sectional view along the cross-sectional line 21B-21B' in FIG. 21), the patterned photoresist PR is formed on the stacking structures 100, and the patterned photoresist PR has an opening 600.

Figure 22:
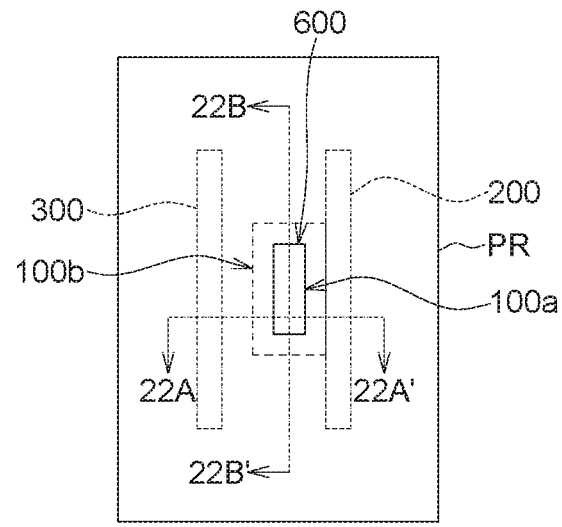
Figure 22A:
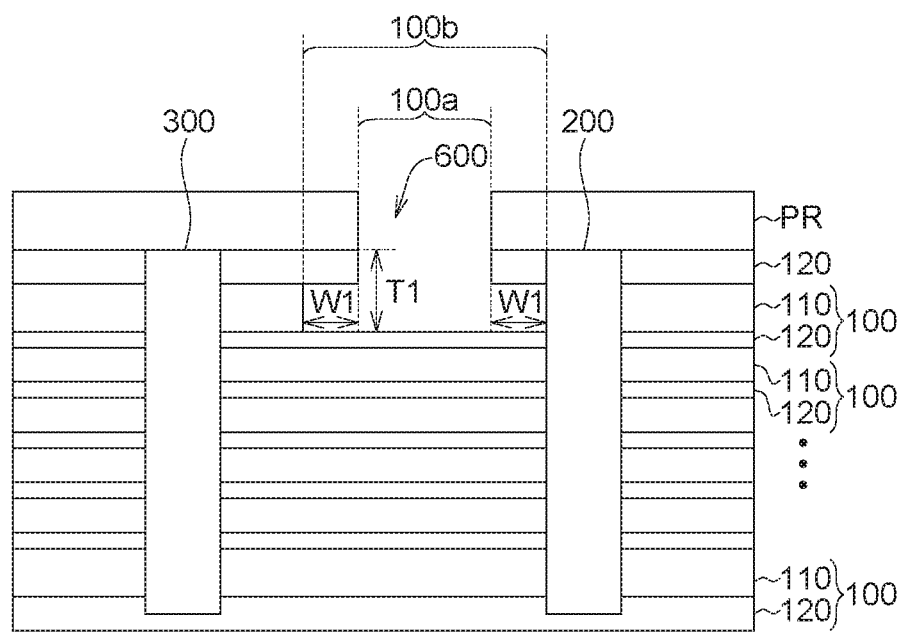
Figure 22B:
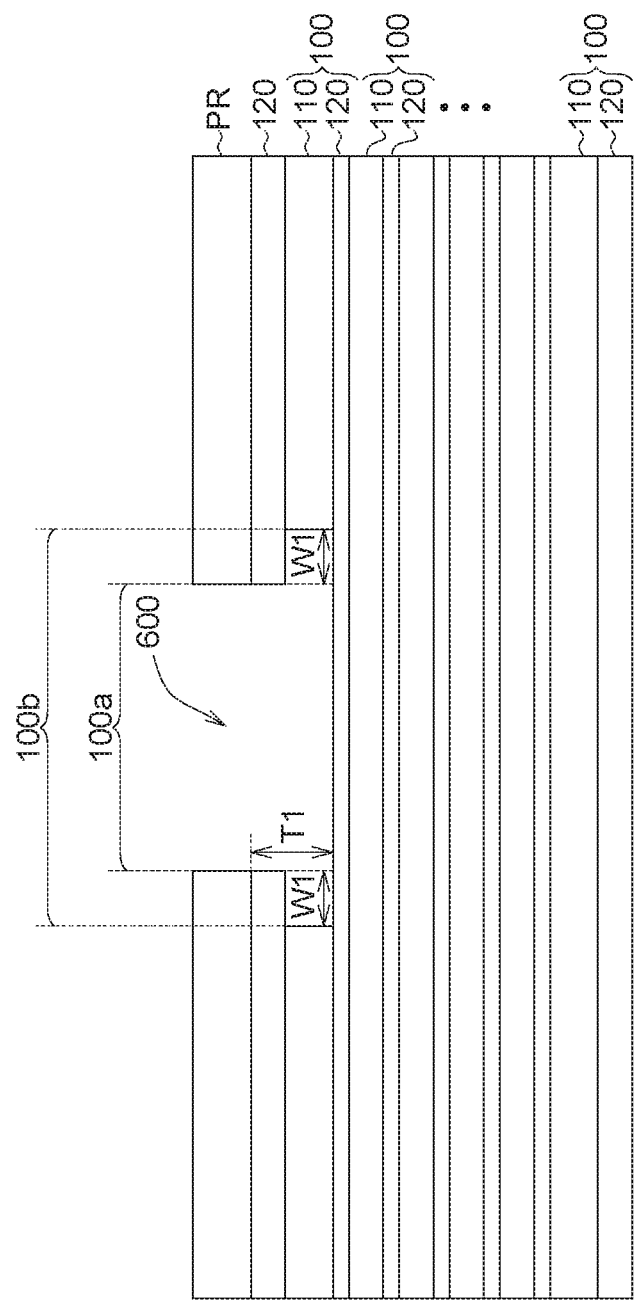

Next, as shown in FIGS. 22-22B (FIG. 22 shows a top view of the present step, FIG. 22A shows a cross-sectional view along the cross-sectional line 22A-22A' in FIG. 22, and FIG. 22B shows a cross-sectional view along the cross-sectional line 22B-22B' in FIG. 22), a dry etching process is performed on the stacking structures 100 by using the patterned photoresist PR as a mask to etch away a thickness T1 of one layer, and then an isotropic etching process is performed on the stacking structures 100 by using the patterned photoresist PR as a mask to trim off a width W1 of one conductive layer 110 of the stacking structures 100. The area of the region 100a of the portion of the stacking structures 100 of which a thickness T1 of one layer is etched away is substantially the same with the area of the opening 600 of the patterned photoresist PR. The region 100b of the opening of the laterally etched conductive layer 110 is equal to the enlarged range of the aforementioned region 100b extended outwards omnidirectionally by a width W1.

Figure 23:
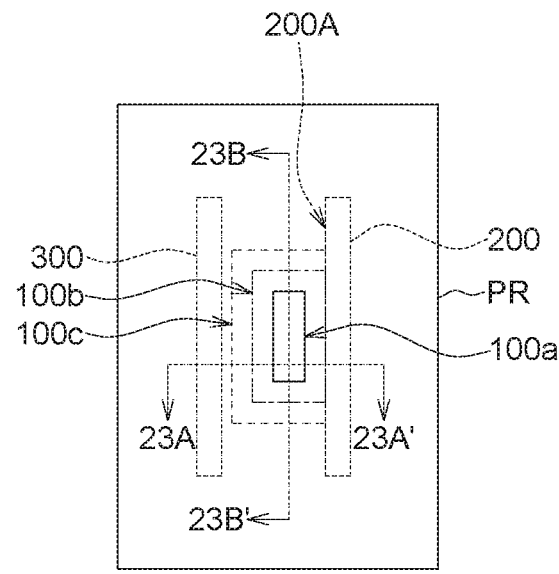
Figure 23A:
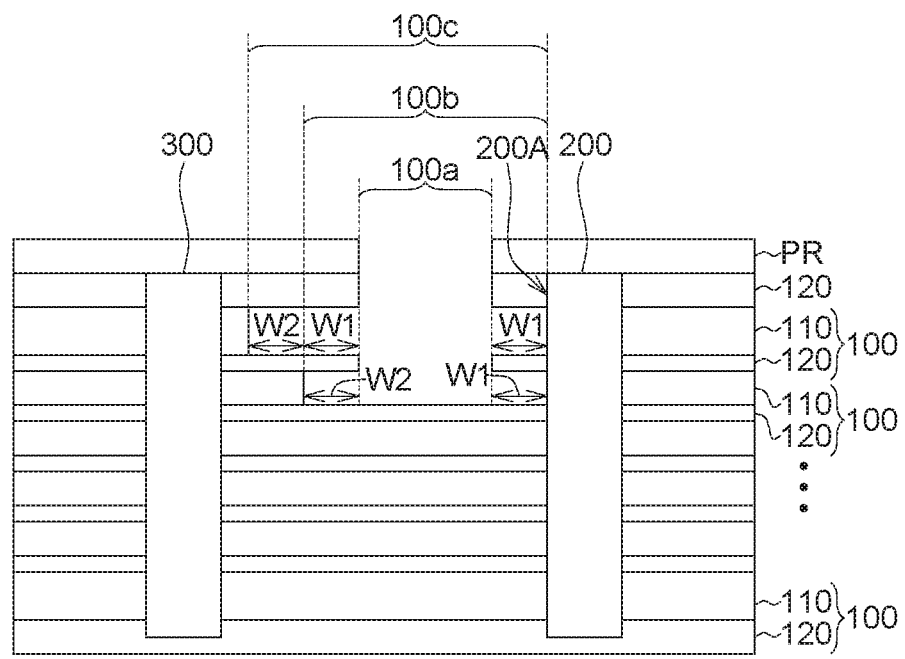
Figure 23B:
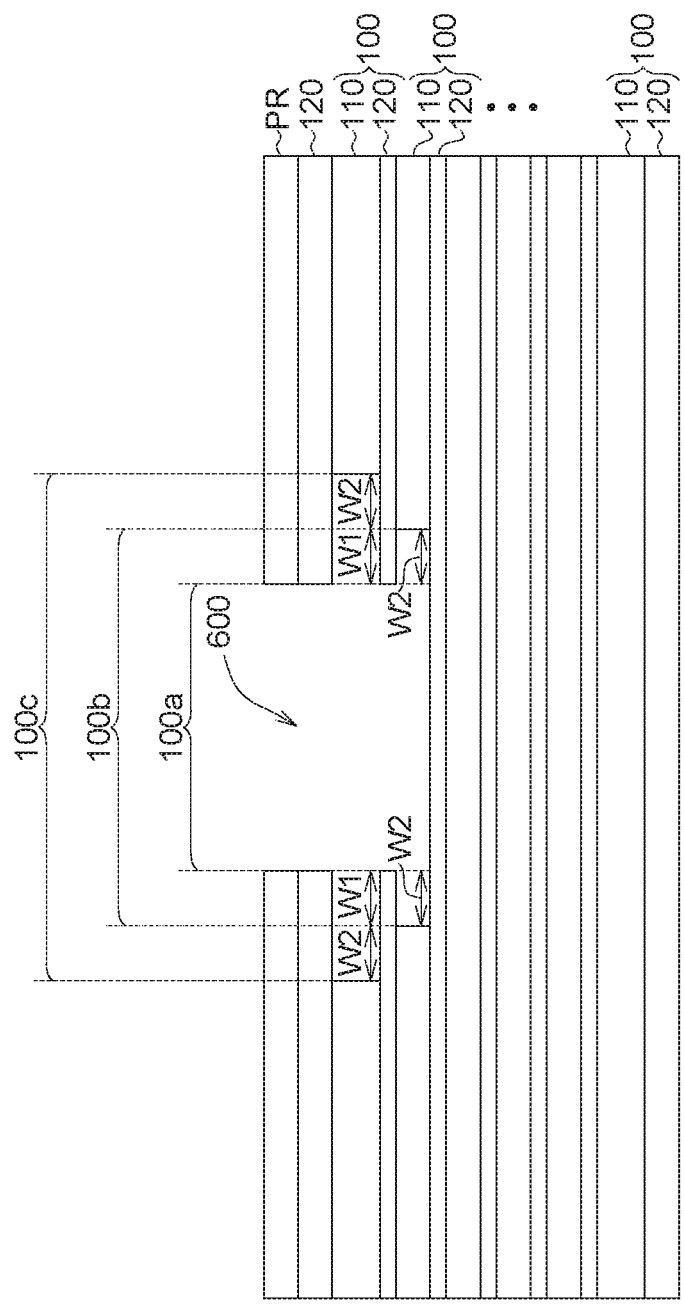

Next, as shown in FIGS. 23-23B (FIG. 23 shows a top view of the present step, FIG. 23A shows a cross-sectional view along the cross-sectional line 23A-23A in FIG. 23, and FIG. 23B shows a cross-sectional view along the cross-sectional line 23B-23B' in FIG. 23), a dry etching process and then an isotropic etching process are continuously performed on the stacking structures 100 by using the patterned photoresist PR as a mask. Since the first etch stop layer 200 is disposed at a location separated from the region 100a by a distance of the width W1, the present isotropic etching process stops at the first sidewall 200A of the first etch stop layer 200, and the present isotropic etching process trims off the a width W2 of two conductive layers 110 of the stacking structures 100 towards other directions. The opening of the conductive layer 110 laterally etched two times has a region 100c, and the region 100c is equal to the enlarged range of the aforementioned region 100b extended outwards by a width W2 except towards the first etch stop layer 200.

Figure 24:
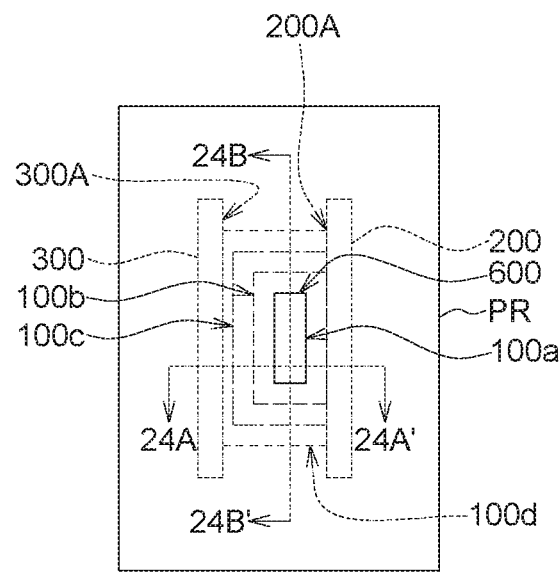
Figure 24A:
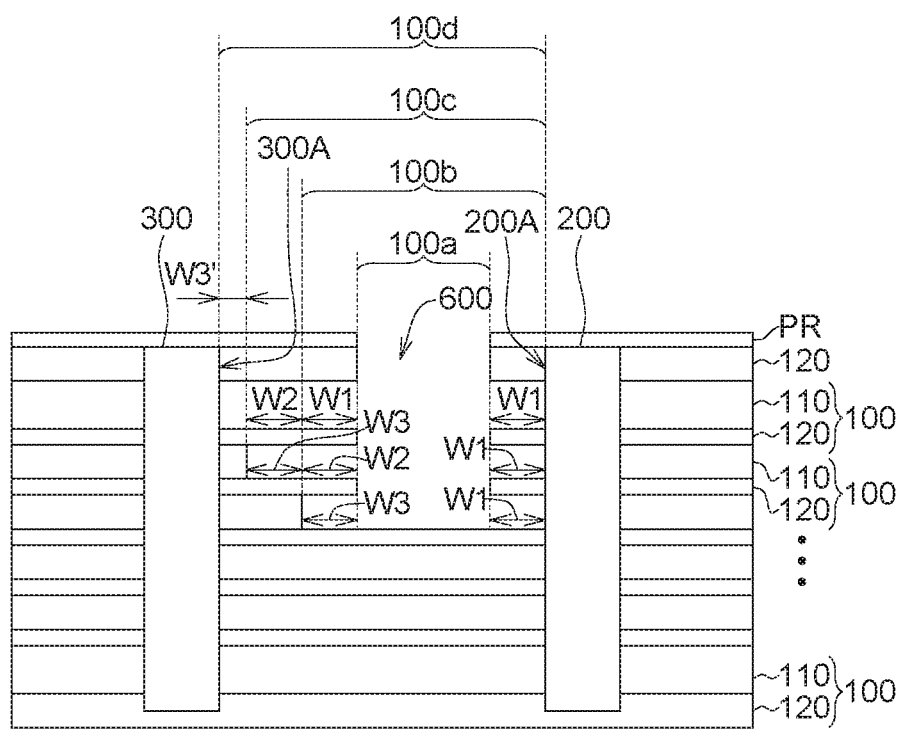

Next, as shown in FIGS. 24-24B (FIG. 24 shows a top view of the present step, FIG. 24A shows a cross-sectional view along the cross-sectional line 24A-24A in FIG. 24, and FIG. 24B shows a cross-sectional view along the cross-sectional line 24B-24B' in FIG. 24), a dry etching process and then an isotropic etching process are continuously performed on the stacking structures 100 by using the patterned photoresist PR as a mask. Since the first etch stop layer 200 is disposed at a location separated from the region 100a by a distance of the width W1, and the second etch stop layer 300 is disposed at a location separated from the region 100c by a distance less than the width W3, the present isotropic etching process stops at the first sidewall 200A of the first etch stop layer 200 and the first sidewall 300A of the second etch stop layer 300, the present isotropic etching process trims off the a width W3 of three conductive layers 110 of the stacking structures 100 towards other two directions, and the present isotropic etching process trims off the a width W3 of two conductive layers 110 and a width W3' of one conductive layer 110 of the stacking structures 100 towards the second etch stop layer 300. The opening of the conductive layer 110 laterally etched three times has a region 100d, and the region 100d is equal to the enlarged range of the aforementioned region 100c extended towards the second etch stop layer 300 by a width W3' and extended towards other two directions by a width W3 except towards the first etch stop layer 200.

Figure 25:
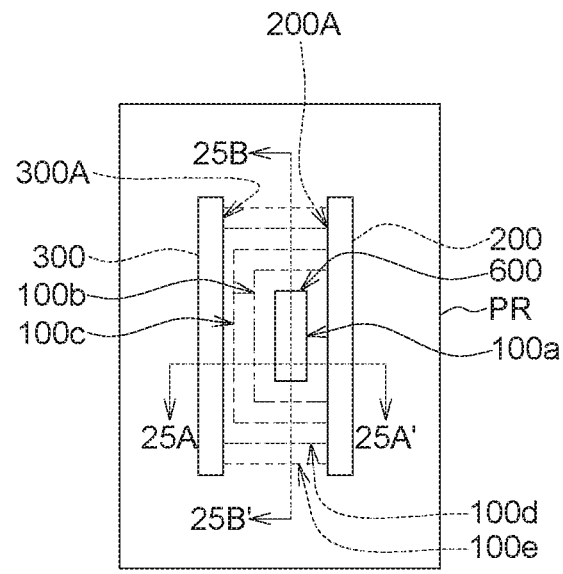
Figure 25A:
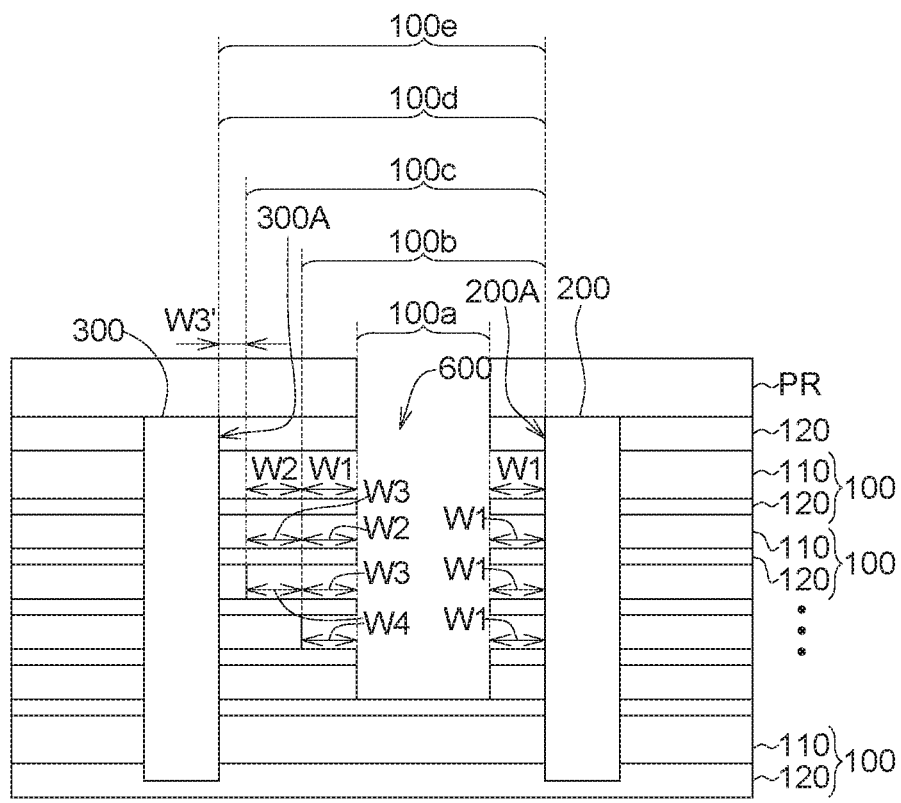
Figure 25B:
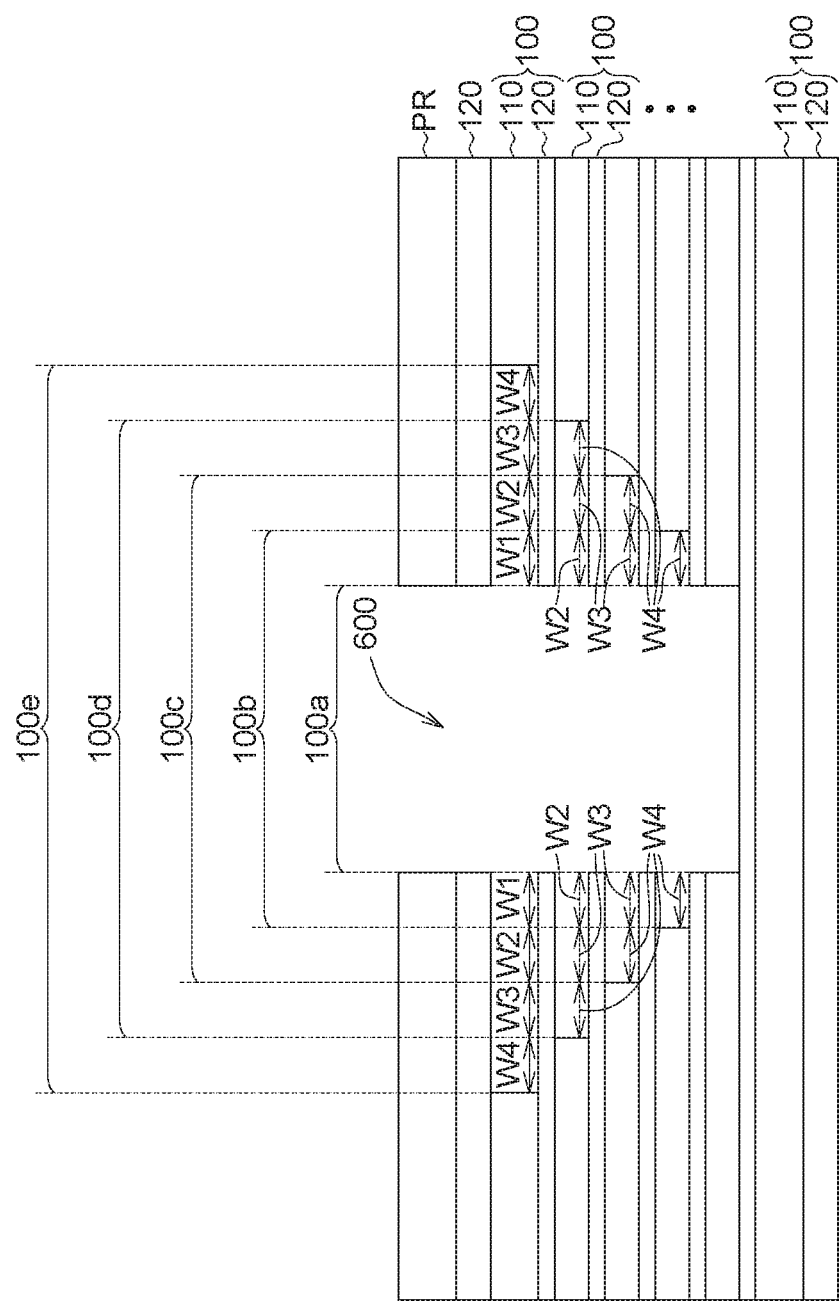

Next, as shown in FIGS. 25-25B (FIG. 25 shows a top view of the present step, FIG. 25A shows a cross-sectional view along the cross-sectional line 25A-25A' in FIG. 25, and FIG. 25B shows a cross-sectional view along the cross-sectional line 25B-25B' in FIG. 25), a dry etching process and then an isotropic etching process are continuously performed on the stacking structures 100 by using the patterned photoresist PR as a mask. Since the first etch stop layer 200 is disposed at a location separated from the region 100a by a distance of the width W1, and the second etch stop layer 300 is disposed at a location separated from the region 100c by a distance less than the width W3, the present isotropic etching process stops at the first sidewall 200A of the first etch stop layer 200 and the first sidewall 300A of the second etch stop layer 300, and the present isotropic etching process trims off the a width W4 of four conductive layers 110 of the stacking structures 100 towards other two directions. The opening of the conductive layer 110 laterally etched four times has a region 100e, and the region 100e is equal to the enlarged range of the aforementioned region 100d extended towards two directions by a width W4 except towards the first etch stop layer 200 and the second etch stop layer 300.

Next, please refer to FIGS. 1, 2A-2D and 16A-18B the patterned photoresist PR is removed, an insulating layer is formed on the stacking structures 100 and filled in the spaces between the insulating layers 120. As such, the conductive layers 110 of the stacking structures 100 have a plurality of contact points, and the contact points are arranged along the first horizontal direction HD1 to form a stair structure having a plurality of stages. The contact points are located at the first sidewall 200A of the first etch stop layer 200, and the contact points are located between the first etch stop layer 200 and the second etch stop layer 300. Next, conductive lines 400 are disposed, and each conductive line 400 is electrically connected to each contact point. As such, the stair contact structure as shown in FIGS. 1 and 2A-2O is formed.

According to the embodiments of the present disclosure, the stair contact structure can be manufactured by multiple etching processes with fewer mask steps, such that the manufacturing process is simplified, the cost is reduced, and the overall manufacturing time can be reduced as well. In addition, the first etch stop layer 200 and/or the second etch stop layer 300 disposed in the stacking structures 100 can not only further reduce the size of the stair contact structure 10/20 along the second horizontal direction HD2 but can also provide supports in the multiple etching processes, preventing the un-etched insulating layers 120 from being collapsed causing serious damages to the overall structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A stair contact structure adjacent to a memory array, comprising:
   a plurality of layers of stacking structures, wherein each stacking structure comprises a conductive layer and an insulating layer, and the conductive layers and the insulating layers are interlaced; and
   a first etch stop layer penetrating through the stacking structures vertically and extending along a first horizontal direction, wherein the conductive layers of the stacking structures located at a first sidewall of the first etch stop layer have a plurality of contact points, and the contact points are arranged along the first horizontal direction to form a stair structure having a plurality of stages, wherein a length along the first horizontal direction of one of the conductive layers of said each stacking structure is smaller than a length along the first horizontal direction of one of the insulating layers positioned on and directly contacting said one of the conductive layers of said each stacking structure;
   wherein the stair contact structure and the memory array are disposed along a second horizontal direction vertical to the first horizontal direction.

2. The stair contact structure according to claim 1, wherein the first etch stop layer has a first length along the first horizontal direction, the stacking structures have a second length along the first horizontal direction, and the second length is larger than the first length.

3. The stair contact structure according to claim 1, wherein the first etch stop layer has a second sidewall opposite to the first sidewall, the first etch stop layer has a top surface, the top surface is kept apart from one contact point of the plurality of contact points by a first distance, the top surface is kept apart from the topmost conductive layer of the conductive layers located at the second sidewall of the first etch stop layer by a second distance, and the first distance is larger than the second distance.

4. The stair contact structure according to claim 1, further comprising:
   a second etch stop layer penetrating through the stacking structures vertically and extending along the first horizontal direction, wherein the contact points are located between the first etch stop layer and the second etch stop layer.

5. The stair contact structure according to claim 4, wherein the second etch stop layer has a third length along the first horizontal direction, the stacking structures have a second length along the first horizontal direction, and the second length is larger than the third length.

6. The stair contact structure according to claim 4, wherein the conductive layers located between the first etch stop layer and the second etch stop layer have a plurality of lengths along a second horizontal direction, the second horizontal direction is perpendicular to the first horizontal direction, and the lengths are different.

7. The stair contact structure according to claim 6, wherein the lengths of the conductive layers increase downwards along a vertical direction, and the vertical direction is perpendicular to the first horizontal direction and the second horizontal direction.

8. The stair contact structure according to claim 1, further comprising:
   a plurality of conductive lines, each conductive line electrically connected to each contact point.

9. A memory structure, comprising:
   a first stair contact structure and a second stair contact structure separated from each other by a trench, the first stair contact structure and the second stair contact structure respectively comprising a plurality of layers of stacking structures, wherein each stacking structure comprises a conductive layer and an insulating layer, the conductive layers and the insulating layers are interlaced, the conductive layers of the first stair contact structure have a plurality of first contact points, the conductive layers of the second stair contact structure have a plurality of second contact points, the first contact points and second contact points are arranged respectively along a first direction and a second direction to form a first stair structure and a second stair structure having a plurality of stages, and the first direction is different from the second direction, wherein a length along the first direction of one of the conductive layers of the first stair contact structure is smaller than a length along the first direction of one of the insulating layers positioned on and directly contacting said one of the conductive layers of the first stair contact structure; and a length along the second direction of one of the conductive layers of the second stair contact structure is smaller than a length along the second direction of one of the insulating layers positioned on and directly contacting said one of the conductive layers of the second stair contact structure; and
   a first memory block and a second memory block respectively electrically connected to the first stair contact structure and the second stair contact structure, wherein the first stair contact structure further comprises:
   a first etch stop layer penetrating through the stacking structures of the first stair contact structure vertically and extending along a first horizontal direction, wherein the first contact points are located at a first sidewall of the first etch stop layer.

10. The memory structure according to claim 9, wherein the conductive layers of the first stair contact structure have a plurality of lengths along the first direction, and the lengths of the conductive layers of the first stair contact structure increase downwards along a vertical direction.

11. The memory structure according to claim 9, wherein the conductive layers of the first stair contact structure have a plurality of first notches, the conductive layers of the second stair contact structure have a plurality of second notches, and the sizes of the first notches and the sizes of the second notches decrease downwards along a vertical direction.

12. The memory structure according to claim 9, further comprising:
   a plurality of conductive lines, each conductive line correspondingly electrically connected to each first contact point or each second contact point.

* * * * *